(12) United States Patent
Lin et al.

(10) Patent No.: US 9,761,549 B2
(45) Date of Patent: Sep. 12, 2017

(54) SEMICONDUCTOR DEVICE AND FABRICATION METHOD

(71) Applicant: TONGFU MICROELECTRONICS CO., LTD., Nantong (CN)

(72) Inventors: Chang-Ming Lin, Nantong (CN); Lei Shi, Nantong (CN); Guo-Hua Gao, Nantong (CN)

(73) Assignee: TONGFU MICROELECTRONICS CO., LTD., Nantong (CN)

( * ) Notice: Subject to any disclaimer, the term of this patent is extended or adjusted under 35 U.S.C. 154(b) by 60 days.

(21) Appl. No.: 14/074,697

(22) Filed: Nov. 7, 2013

(65) Prior Publication Data
US 2014/0124929 A1    May 8, 2014

(30) Foreign Application Priority Data

Nov. 8, 2012   (CN) .......................... 2012 1 0444357
Nov. 8, 2012   (CN) .......................... 2012 1 0444358

(51) Int. Cl.
*H01L 23/00*      (2006.01)
*H01L 23/31*      (2006.01)

(52) U.S. Cl.
CPC .............. *H01L 24/11* (2013.01); *H01L 24/03* (2013.01); *H01L 24/05* (2013.01); *H01L 24/13* (2013.01); *H01L 23/3192* (2013.01); *H01L 2224/0345* (2013.01); *H01L 2224/03462* (2013.01); *H01L 2224/03472* (2013.01);
(Continued)

(58) Field of Classification Search
CPC .. H01L 24/03–24/18; H01L 2224/0401; H01L 2224/05567; H01L 2224/05011; H01L 2224/05571; H01L 2224/05572; H01L 2224/13011; H01L 2224/13021; H01L 2224/13022; H01L 2224/13015;
(Continued)

(56) References Cited

U.S. PATENT DOCUMENTS 5,872,399 A * 2/1999 Lee ................... H01L 23/49816
                                                      257/668
6,384,343 B1 * 5/2002 Furusawa ..................... 174/260
(Continued)

FOREIGN PATENT DOCUMENTS

CN           1630029 A         6/2005
CN           1893051 A         1/2007
(Continued)

*Primary Examiner* — Khiem D Nguyen
*Assistant Examiner* — Pauline Vu
(74) *Attorney, Agent, or Firm* — Anova Law Group, PLLC

(57) ABSTRACT

Semiconductor devices and methods are provided. The semiconductor device can include a semiconductor substrate, a plurality of solder pads disposed on the semiconductor substrate, a first insulating layer disposed over the semiconductor substrate, a columnar electrode disposed over the solder pad, and a solder ball disposed on the columnar electrode. The first insulating layer can include a first opening to expose a solder pad of the plurality of solder pads. The columnar electrode can include a bulk material and a through hole in the bulk material. The through hole can expose at least a surface portion of the solder pad. The solder ball can include a convex metal head on a top surface of the bulk material of the columnar electrode, and a filling part filled in the through hole.

3 Claims, 22 Drawing Sheets

(52) U.S. Cl.
CPC .............. *H01L 2224/0401* (2013.01); *H01L 2224/05008* (2013.01); *H01L 2224/05011* (2013.01); *H01L 2224/05124* (2013.01); *H01L 2224/05144* (2013.01); *H01L 2224/05147* (2013.01); *H01L 2224/05166* (2013.01); *H01L 2224/05181* (2013.01); *H01L 2224/05548* (2013.01); *H01L 2224/05562* (2013.01); *H01L 2224/05567* (2013.01); *H01L 2224/05572* (2013.01); *H01L 2224/05655* (2013.01); *H01L 2224/1132* (2013.01); *H01L 2224/11849* (2013.01); *H01L 2224/13006* (2013.01); *H01L 2224/13011* (2013.01); *H01L 2224/13015* (2013.01); *H01L 2224/13018* (2013.01); *H01L 2224/13076* (2013.01); *H01L 2224/13111* (2013.01); *H01L 2224/13147* (2013.01)

(58) Field of Classification Search
CPC . H01L 2224/13018; H01L 2224/13023; H01L 23/3192
See application file for complete search history.

(56) References Cited

U.S. PATENT DOCUMENTS

| | | | |
|---|---|---|---|
| 6,387,734 B1 * | 5/2002 | Inaba et al. | 438/125 |
| 6,841,872 B1 * | 1/2005 | Ha et al. | 257/736 |
| 7,319,265 B1 * | 1/2008 | Wang | H01L 21/486 |
| | | | 257/673 |
| 2002/0064930 A1 * | 5/2002 | Ishikawa | 438/612 |
| 2002/0167085 A1 * | 11/2002 | Ohuchi et al. | 257/750 |
| 2003/0214036 A1 * | 11/2003 | Sarihan et al. | 257/738 |
| 2003/0234277 A1 * | 12/2003 | Dias et al. | 228/180.22 |
| 2004/0134974 A1 * | 7/2004 | Oh et al. | 228/245 |
| 2005/0090090 A1 * | 4/2005 | Kim et al. | 438/613 |
| 2005/0167832 A1 * | 8/2005 | Kainou | H01L 23/3114 |
| | | | 257/738 |
| 2005/0277283 A1 * | 12/2005 | Lin | H01L 23/53238 |
| | | | 438/618 |
| 2006/0131365 A1 * | 6/2006 | Shigihara et al. | 228/180.22 |
| 2006/0292851 A1 * | 12/2006 | Lin | H01L 24/13 |
| | | | 438/618 |
| 2007/0020906 A1 * | 1/2007 | Chiu et al. | 438/597 |
| 2007/0020916 A1 * | 1/2007 | Farnworth | H01L 24/11 |
| | | | 438/622 |
| 2007/0069394 A1 * | 3/2007 | Bachman et al. | 257/780 |
| 2007/0085182 A1 * | 4/2007 | Yamaguchi | 257/678 |
| 2008/0150134 A1 * | 6/2008 | Shinkai | H01L 24/13 |
| | | | 257/737 |
| 2009/0014871 A1 * | 1/2009 | Meyer et al. | 257/737 |
| 2009/0098723 A1 | 4/2009 | Yu | |
| 2010/0163292 A1 * | 7/2010 | Tsai et al. | 174/261 |
| 2011/0266670 A1 | 11/2011 | England et al. | |
| 2012/0043654 A1 * | 2/2012 | Lu | C25D 5/10 |
| | | | 257/737 |
| 2012/0067635 A1 * | 3/2012 | Nang | B23K 1/0016 |
| | | | 174/260 |
| 2012/0326296 A1 * | 12/2012 | Choi | H01L 23/3171 |
| | | | 257/737 |

FOREIGN PATENT DOCUMENTS

| | | | | |
|---|---|---|---|---|
| CN | 101315915 A | | 12/2008 | |
| CN | 101728347 A | | 6/2010 | |
| CN | 102157477 A | | 8/2011 | |
| CN | 102915982 A | * | 2/2013 | .......... H01L 23/485 |
| CN | 202917473 U | * | 5/2013 | .......... H01L 23/485 |
| CN | 202917473 U | | 5/2013 | |
| CN | 202917477 U | * | 5/2013 | ........ H01L 2224/10 |
| JP | 2012054297 A | | 3/2012 | |

* cited by examiner

SEMICONDUCTOR DEVICE AND FABRICATION METHOD

CROSS-REFERENCES TO RELATED APPLICATIONS

This application claims the priority of Chinese patent application No. 201210444358.4, filed on Nov. 8, 2012, and Chinese patent application No. 201210444357.X, filed on Nov. 8, 2012, the entire contents of all of which are incorporated herein by reference.

FIELD OF THE DISCLOSURE

The present disclosure generally relates to semiconductor technologies and, more particularly, relates to methods and structures for semiconductor IC packaging.

BACKGROUND

Traditionally, integrated circuit (IC) chips are connected to external circuits by metal wires (e.g., wire bonding). However, as critical dimension of the IC chips reduces and as scale of the ICs increases, such wire bonding technique is no longer applicable.

Chip scale package (CSP) is considered as the latest generation of chip packaging technology. CSP packaging products have small size, good electrical properties, and good thermal properties. Wafer-chip-scale package (WCSP) is one of the chip scale packages and includes a process of first packaging the whole wafer and then, after testing, dicing the wafer into individual CSP circuits.

FIG. 1 depicts a conventional semiconductor device including a wafer level CSP structure. As shown, the semiconductor device can include a semiconductor substrate 11 having a solder pad 12 and a passivation layer 14 on surface of the semiconductor substrate 11. The passivation layer 14 has an opening exposing the surface of the solder pad 12. A re-wiring layer 16 is on a surface portion of the passivation layer 14 and includes an opening in the passivation layer 14, such that the re-wiring layer 16 is connected to the solder pad 12. A columnar electrode 17 is on surface of the re-wiring layer 16 outside of the opening. An insulating layer 20 covers the re-wiring layer 16 and a portion of the passivation layer 14. The insulating layer 20 has a top surface flushed with a top surface of the columnar electrode 17. A solder ball 21 is disposed on the columnar electrode 17.

The solder ball in conventional semiconductor devices, however, may be easily detached from the columnar electrode. The disclosed methods and devices are directed to solve one or more problems set forth above and/or other problems.

BRIEF SUMMARY OF THE DISCLOSURE

One aspect of the present disclosure includes a semiconductor device. The semiconductor device can include a semiconductor substrate, a plurality of solder pads disposed on the semiconductor substrate, a first insulating layer disposed over the semiconductor substrate, a columnar electrode disposed over the solder pad, and a solder ball disposed on the columnar electrode. The first insulating layer can include a first opening to expose a solder pad of the plurality of solder pads. The columnar electrode can include a bulk material and a through hole in the bulk material. The through hole can expose at least a surface portion of the solder pad. The solder ball can include a convex metal head on a top surface of the bulk material of the columnar electrode, and a filling part filled in the through hole.

Another aspect of the present disclosure includes a method for forming a semiconductor device by providing a semiconductor substrate including a plurality of solder pads on the semiconductor substrate. A first insulating layer can be formed on the semiconductor substrate, the first insulating layer including a first opening to expose a solder pad of the plurality of solder pads. A columnar electrode can be formed over the solder pad, the columnar electrode including a bulk material and a through hole in the bulk material, and the through hole exposing at least a surface portion of the solder pad. A solder ball can be formed on the columnar electrode, the solder ball including a convex metal head on a top surface of the bulk material of the columnar electrode and a filling part filled in the through hole.

Another aspect of the present disclosure includes a semiconductor device. The semiconductor device can include a semiconductor substrate, a plurality of solder pads disposed on the semiconductor substrate, a columnar electrode disposed on a solder pad of the plurality of solder pads, and a solder ball disposed on the columnar electrode. The columnar electrode can include a bulk material and a plurality of protruded parts disposed on a perimeter sidewall of the bulk material. The solder ball can include a convex metal head disposed on a top surface of the columnar electrode, and a skirt-shaped part on an outer sidewall of the bulk material.

Other aspects of the present disclosure can be understood by those skilled in the art in light of the description, the claims, and the drawings of the present disclosure.

BRIEF DESCRIPTION OF THE DRAWINGS

FIG. 19 illustrates a flowchart of another exemplary method for forming a semiconductor device consistent with the disclosed embodiments;

FIGS. 20-40 illustrate an exemplary semiconductor device corresponding to certain stages during its formation in accordance with various disclosed embodiments;

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

In a wafer level CSP structure of a semiconductor device, since the solder ball is only in contact with the top surface of the columnar electrode, the contact area there-between is small and the adhesion/binding there-between is poor. When subjected to external forces, the solder ball is easily detached from the top surface of the columnar electrode or cracks are formed at the contact area with the columnar electrode. This may adversely affect subsequent packaging processes and the resultant packaged device is likely to fail.

As disclosed, an exemplary semiconductor device can include a columnar electrode and a solder ball disposed on the columnar electrode. The columnar electrode can further include through-hole(s) in the bulk material of the columnar electrode. The solder ball can include a convex metal head disposed on a top surface of the columnar electrode, and a filling part connected to the convex metal head and used to fill the through-hole(s) in the columnar electrode. In this manner, the solder ball and the columnar electrode can constitute a bolt-like structure, and the filling part of the solder ball can be used as a pin of the bolt-like structure inserted in the columnar electrode. As such, the solder ball can be in contact with the top surface of the columnar electrode, and can also be in contact with the inside of the columnar electrode. The contact area along with adhesion/binding between the solder ball and the column electrode therefore significantly increase, such that the solder ball can bear greatly-enhanced external forces, and stay on the columnar electrode without falling off.

Figure 1:
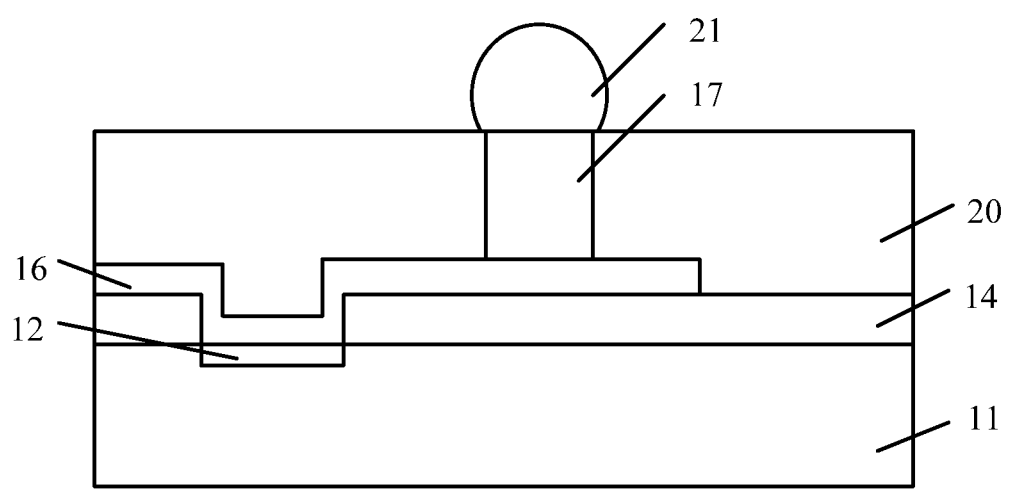
FIG. 1 illustrates a conventional semiconductor device.
Figure 2:
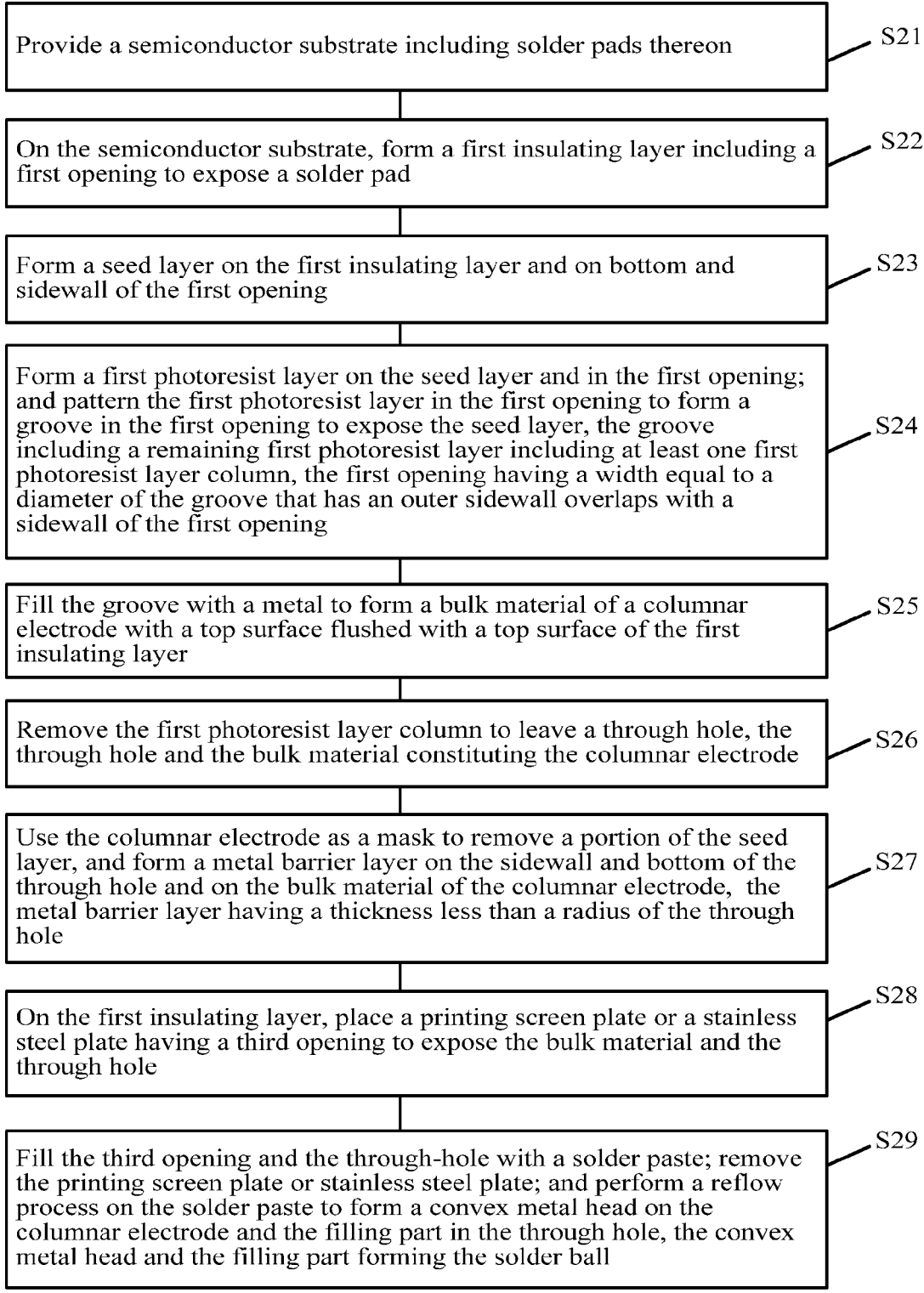
FIG. 2 illustrates a flowchart of an exemplary method for forming a semiconductor device consistent with the disclosed embodiments.

FIG. 2 illustrates a flowchart of an exemplary method for forming a semiconductor device consistent with the disclosed embodiments. FIGS. 3-15 illustrate an exemplary semiconductor device corresponding to certain stages during its formation in accordance with various disclosed embodiments.

Figure 3:
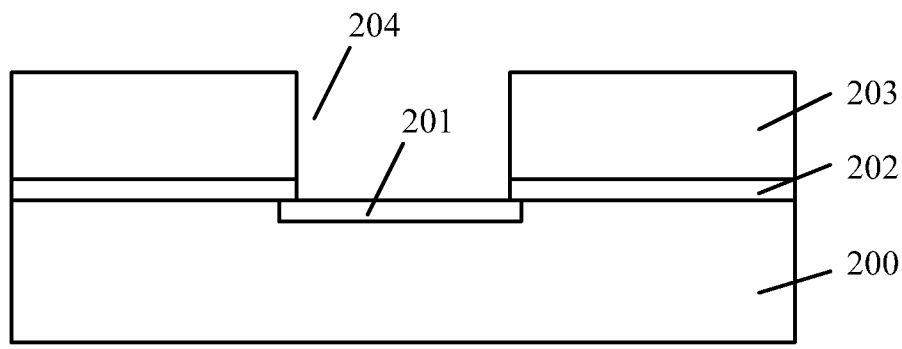
FIGS. 3-15 illustrate an exemplary semiconductor device corresponding to certain stages during its formation in accordance with various disclosed embodiments.

Referring to FIG. 3, a semiconductor substrate 200 is provided and connected to a plurality of IC chips (not shown). A solder pad 201 is connected to one of the plurality of IC chips and is formed on the semiconductor substrate 200 (Step S21).

The solder pad 201 can be made of aluminum, copper, gold, silver, and/or other suitable material(s). Note that although one solder pad 201 is shown in FIG. 3, the semiconductor substrate 200 can include a desired number of solder pads in accordance with various embodiments.

A passivation layer 202 is formed over the semiconductor substrate 200. The passivation layer 202 has an opening to expose an entire surface or a surface portion of the solder pad 201. The passivation layer 202 is formed to protect the IC chips (not shown) formed on/in the semiconductor substrate 200. The passivation layer 202 can be made of a material including silicon nitride, borosilicate glass, phosphorosilicate glass, boron-phosphorosilicate glass, polyimide, or combinations thereof.

A first insulating layer 203 is formed on surface of the passivation layer 202. A first opening 204 is formed through the first insulating layer 203 and the passivation layer 202 to expose at least a surface portion of the solder pad 201 (Step S22).

The first insulating layer 203 can be used as an electrical isolation layer and/or a sealing layer. The first insulating layer 203 can be made of polybenzoxazole (PBO), polyimide, and/or other suitable organic resins. In one embodiment, the first insulating layer 203 can be formed before forming a columnar electrode. This is different from a process of forming an insulating layer after formation of the columnar electrode, where materials of the first insulating layer may fill in the through hole of the columnar electrode, and removal of such materials from the through hole may be difficult and may damage the bulk material of the columnar electrode.

In other embodiments, however, the first insulating layer can be formed on the columnar electrode after the formation of the columnar electrode in a certain process. For example, a columnar electrode can be formed on the exposed surface of the solder pad, followed by forming a first insulating layer on the passivation layer. The first insulating layer can have a top surface flushed with a top surface of the columnar electrode. A portion of the first insulating layer that fills the through hole of the columnar electrode can be removed. In some cases, when removing such portion of the first insulating layer from the through hole of the columnar electrode, other portion of the first insulating layer that surrounds the columnar electrode can also be removed. A solder ball can be formed on the columnar electrode.

Figure 4:
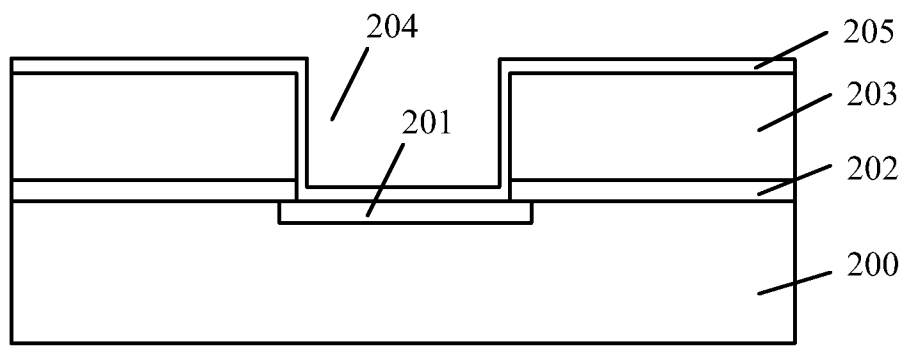

Referring to FIG. 4, a seed layer 205 is formed on surface of the first insulating layer 203 and on bottom and sidewall of the first opening 204 (Step S23).

The seed layer 205 can be used as a power supply layer when subsequently forming the columnar electrode by, e.g., electroplating. The seed layer 205 can be formed of a layer of chromium, titanium, tantalum, copper, silver, gold, or combinations thereof. For example, the seed layer 205 can include a single layer structure having a metal layer of chromium or titanium or tantalum. Alternatively, the seed layer 205 can include a multilayer-stacked structure including a metal layer of chromium or titanium or tantalum stacked with a metal layer of copper or silver or gold. The seed layer 205 can be formed by a sputtering process. In various embodiments, the seed layer 205 can be used as a diffusion barrier layer to prevent metal of the subsequently-formed columnar electrode from diffusing into the first insulating layer 203 and to enhance adhesion/binding between the subsequently-formed columnar electrode and the insulating layer 203. It should be noted that, the term "first opening" hereinafter refers to the opening after formation of the seed layer 205 as shown in FIG. 4.

Figure 5:
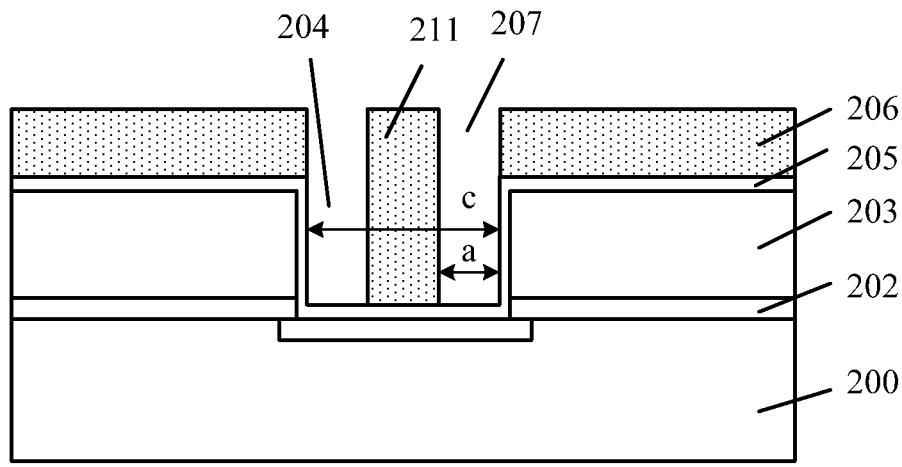
Figure 6:
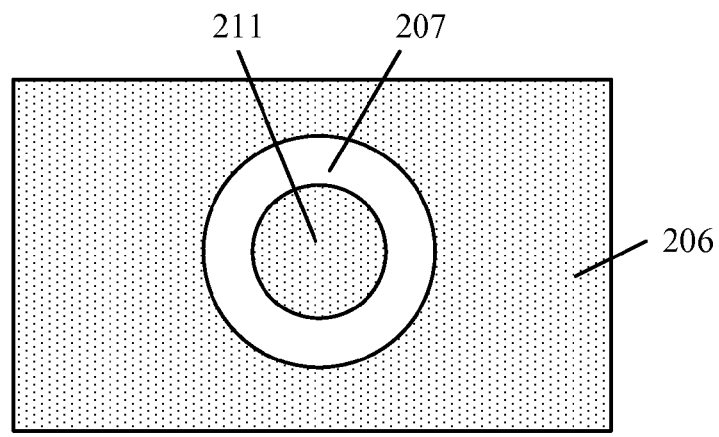

FIG. 6 is a schematic showing a top view of a semiconductor structure shown in FIG. 5. Referring to FIG. 5, a first photoresist layer 206 is formed on surface of the seed layer 205. The first photoresist layer 206 fills up the first opening 204 shown in FIG. 4. As shown in FIG. 5, a portion of the first photoresist layer 206 in the first opening 204 can then be patterned to form grooves 207 and to expose surface portions of the seed layer 205 in the first opening 204. After patterning, a remaining portion of the first photoresist layer in the first opening 204 can be referred to as a first photoresist layer column 211.

The first photoresist layer column 211 can be more than one, although FIG. 5 shows one first photoresist layer column as an example. The groove 207 can have a diameter (or width) equal to the diameter (or width) c of the first opening 204. A lower portion of the sidewall of the groove 207 includes a sidewall of the first opening 204. The groove 207 can have an outer sidewall having a cross-sectional shape similar to or the same as a cross-sectional shape of the sidewall of the first opening 204 (Step S24).

It should be noted that a diameter of a groove (or a bulk element) refers to the longest distance from one end of the outer sidewall of the groove (or the bulk element) to another end of the outer sidewall of the groove (or the bulk element). A width of a groove (or a bulk element) refers to a straight distance from the outer sidewall of the groove (or the bulk element) to the inner sidewall of the groove (or the bulk element), e.g., in a direction of the diameter.

The groove 207 can be formed by exposure and development processes. The groove 207 can be subsequently filled with metal to form a bulk material of the columnar electrode. The first photoresist layer column 211 can be subsequently removed to form through-hole(s) in the columnar electrode. It should be noted that the groove can have at least one first photoresist layer column and the at least one first photoresist layer column does not contact the outer sidewall of the groove.

In one embodiment, a number of one first photoresist layer column 211 is disposed in the opening. As shown in FIGS. 5-6, the first photoresist layer column 211 can be positioned in the middle of the groove 207. The first photoresist layer column 211 can have a sidewall with a circular cross-sectional shape. The sidewall of the first opening 204 can have a circular cross-sectional shape. The inner sidewall of groove 207 can have a circular cross-sectional shape. The cross-sectional shape of the groove 207 can be an annular ring having a width a. The radius of the first photoresist layer column 211 and the width a of the groove 207 can have a ratio ranging from about 1/10 to about 10/1, for example, ranging from about 1:3 to about 3:1. As such, when subsequently forming a columnar electrode, a radius of the through-hole in the columnar electrode and a width of the bulk material of the columnar electrode can have a ratio ranging from about 1/10 to about 10/1 to provide the bulk material of columnar electrode with a certain width and thus with desired mechanical strength. In addition, the bottom surface of the bulk material of the columnar electrode can have sufficient contact area with the underlying solder pad to provide sufficient adhesion/binding there-between, while preventing gap formation between the bulk material of the columnar electrode and solder pad to avoid increased contact resistance or to avoid generation of disconnection.

In another embodiment, one first photoresist layer column can be included; the sidewall cross-section of the first opening can be square or any other polygonal shape; the outer sidewall of the groove can have a same cross-sectional shape as the sidewall cross-section of the first opening; and the sidewall cross-section of the first photoresist layer column can be round, square, or polygonal.

In still another embodiment, one first photoresist layer column can be included; the groove can include a plurality independent sub-grooves (and thus subsequently including sub-bulk materials as a part of the bulk material of the columnar electrode) distributed with equal angular distribution based on a center of the first photoresist layer column as the center of a circle. The first photoresist layer can be filled between adjacent sub-grooves. After subsequently forming a columnar electrode and a solder ball, contact area between the solder ball and the columnar electrode can be sufficiently large to facilitate improvement of the adhesion/binding between the solder ball and the columnar electrode. In a specific embodiment, the cross-section of the sub-groove can be a portion of an annular ring.

Figure 7:
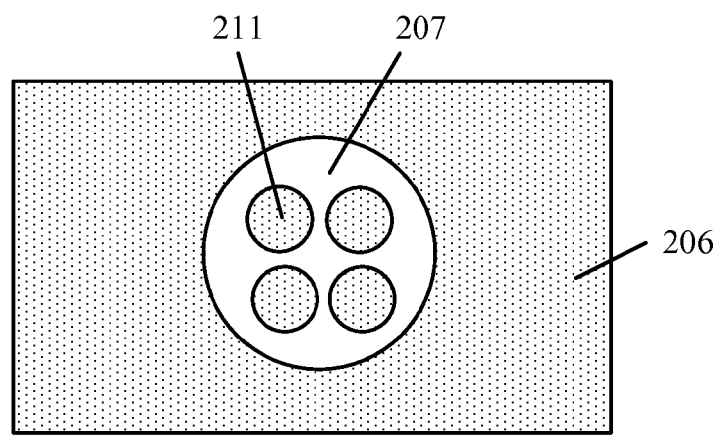

In still another embodiment, more than one first photoresist layer column can be included; and the first photoresist layer column can be independently distributed in the groove. In an example as shown in FIG. 7, four first photoresist layer columns 211 are included. The four first photoresist layer columns 211 can be independently distributed in the groove 207. The four first photoresist layer columns 211 can be arranged as a matrix. When subsequently removing the first photoresist layer columns 211, a number of four through holes can be formed in the bulk material of the columnar electrode arranged as the matrix, followed by forming the filling part of a solder ball in the through-hole.

In still another embodiment, when more than one first photoresist layer column is included, the first photoresist layer columns can be arranged to be distributed along a straight line, along a plurality of parallel lines, along intersecting lines, along concentric circles, along a concentric annular ring, along a polygonal shape, along a star shape, along a number of rays from the groove as a center, and/or distributed irregularly. When subsequently removing the first photoresist layer columns, through holes formed in the bulk material of a columnar electrode can have a position corresponding to the position of the first photoresist layer columns. Accordingly, the through holes formed in the bulk material of the columnar electrode can thus be distributed along a straight line, along a plurality of parallel lines, along intersecting lines, along concentric circles, along a concentric annular ring, along a polygonal shape, along a star shape, along a number of rays from the groove as a center, and/or distributed irregularly. Note that the description (e.g., distributed along a straight line, a plurality of parallel lines, etc.) of such arrangements of the first photoresist layer columns (and thus the through holes and the filling parts) is based on a top view of the first photoresist layer columns on the semiconductor substrate, e.g., by using a line to trace a center of each of the first photoresist layer columns.

Figure 8:
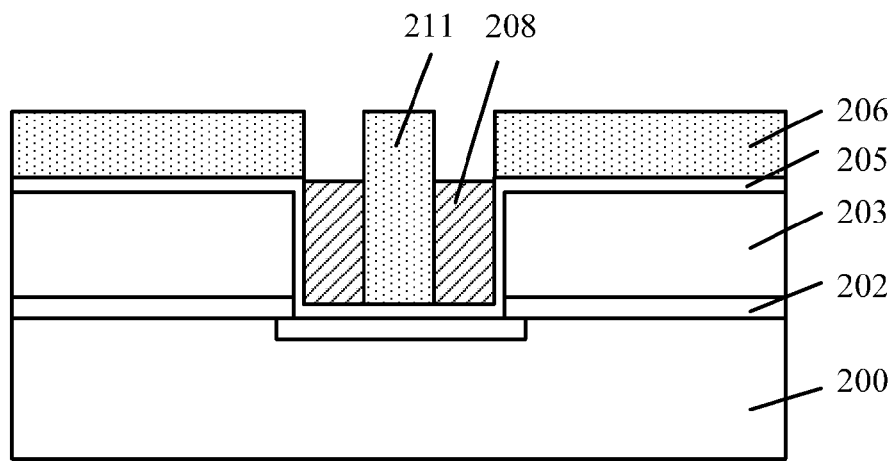

Referring to FIG. 8, metal can be filled in the groove 207 to form a bulk material 208 of a columnar electrode 210. The columnar electrode 210 can have a top surface flushed with or slightly above a top surface of the first insulating layer 203 (Step S25).

The metal to fill the groove 207 can include, e.g., copper, by a process of electroplating. For example, a height of the formed columnar electrode 210 can be controlled by controlling the time for electroplating.

Figure 9:
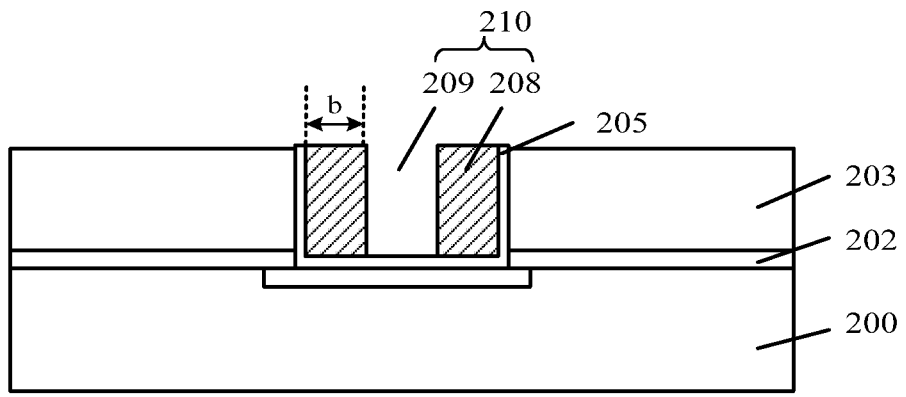
Figure 10:
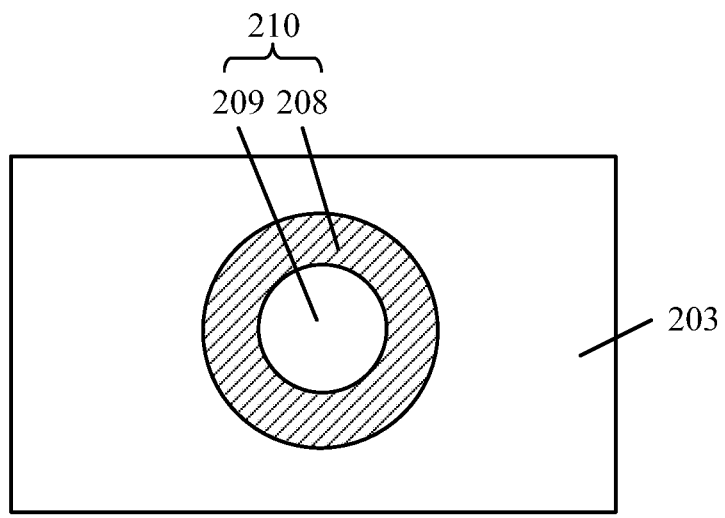

FIG. 10 shows a top view of the structure shown in FIG. 9. Note that the seed layer 205 is not illustrated in FIG. 10. Referring to FIGS. 9-10, the first photoresist layer column(s) 211 and the first photoresist layer 206 are removed to form through hole(s) 209 positioned corresponding to a position of the first photoresist layer column(s) 211. The through hole(s) 209 together with the bulk material of the filled metal constitute the columnar electrode 210 (Step S26). Filling part(s) of a solder ball can be subsequently formed by filling the through-hole 209 with, e.g., tin solder.

The columnar electrode 210 can then be used as a mask to remove a first portion of the seed layer 205 from the first insulating layer. Prior to the removal, a photoresist mask layer can be formed on the columnar electrode 210 to protect a second portion of the seed layer 205 at the bottom of the bulk material and the through hole(s) 209 of the columnar electrode 210 during the removal. After the first portion of the seed layer 205 is removed from the first insulating layer, the photoresist mask layer can be removed.

In one embodiment, when one first photoresist layer column 211 is included, after removal, one through hole 209 can be formed in the middle of the bulk material of the columnar electrode and can be subsequently filled with, e.g., tin solder to form the filling part of the solder ball. The radius of the through hole 209 and the width b of the bulk material of the columnar electrode 210 can range from about 1/10 to about 10/1, for example, from about 1:3 to about 3:1, such that the columnar electrode 210 has a desired width to ensure a mechanical strength and to provide sufficient contact area between the bottom surface of the columnar electrode and the underlying solder pad to maintain sufficient adhesion/binding there-between, while preventing gap formation between the bulk material of the columnar electrode and solder pad to avoid increased contact resistance or to avoid generation of disconnection.

In other embodiments, when more than one first photoresist layer column is included, the removal of the first photoresist layer column can form more than one corresponding through hole. The through holes can be arranged to be distributed along a straight line, along a plurality of parallel lines, along intersecting lines, along concentric circles, along a concentric annular ring, along a polygonal shape, along a star shape, along a number of rays from the bulk material of the first photoresist layer column as a center, and/or distributed irregularly.

Figure 11:
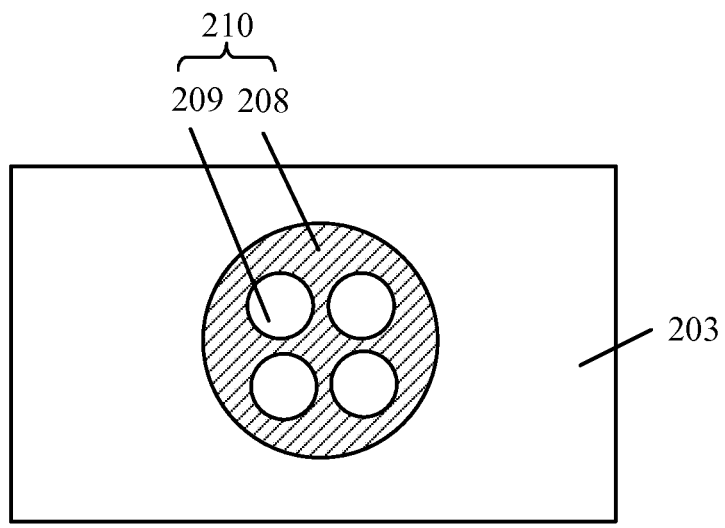

For example, referring to FIG. 11, after removal of four first photoresist layer columns 211 arranged as a matrix, four through holes 209 arranged as the matrix can be formed in the bulk material 208 of the columnar electrode 210.

Figure 12:
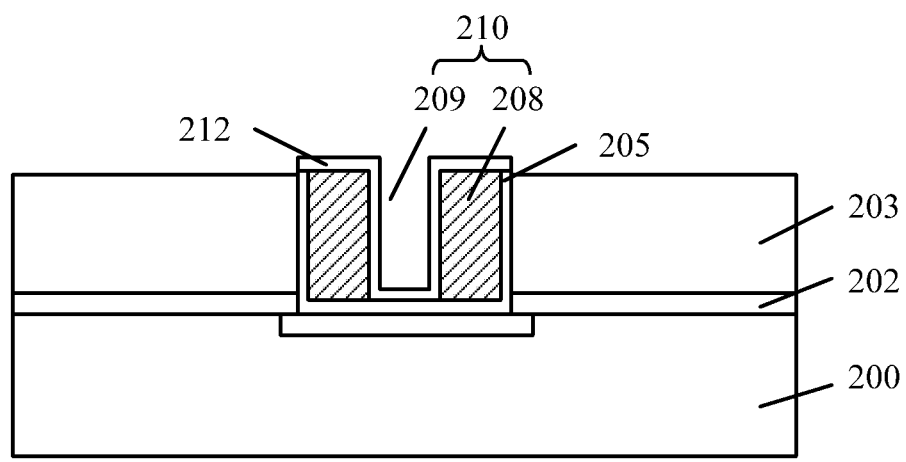

Referring to FIG. 12, a metal barrier layer 212 can be formed on the sidewall and bottom of the through hole 209 and on surface of the bulk material 208 of the columnar electrode 210 (Step S27).

In one embodiment, formation of the metal barrier layer 212 between a solder ball and the bulk material 208 of the columnar electrode can prevent direct contact between the bulk material of the columnar electrode 210 and the solder ball and prevent generation of brittle copper-tin intermetallic compound at the contact surface between the solder ball and the columnar electrode. This can increase reliability of solder joints. Unlike conventional methods where the solder ball and the columnar electrode are in direct contact, in a high temperature environment, copper in a columnar electrode may rapidly diffuse into a tin solder ball to form copper-tin intermetallic compound at the contact surface between the solder ball and the columnar electrode. The brittle copper-tin intermetallic compound may reduce the mechanical strength at the contact interface, cause damage or crack at the solder joint between the intermetallic compound and the solder, and adversely affect soldering reliability.

The metal barrier layer 212 can include a double layer structure of nickel tin and/or nickel silver, and/or having a layer of tin, silver, gold, or a tin alloy on surface of a nickel layer to prevent oxidation of the nickel. In one embodiment, the metal barrier layer 212 can be a double-layer structure of nickel tin, and nickel can prevent copper from diffusing outward. In some cases, even if some of the copper and tin are diffused into the metal barrier layer 212, a nickel-copper compound with high mechanical strength and good thermal resistance can be formed at the interface of the metal barrier layer 212 and the columnar electrode. Likewise, a nickel-tin compound with high mechanical strength, high mechanical hardness, and uniform surface can be formed at the interface of the metal barrier layer 212 and the solder ball, without causing problems including reduced mechanical strength and welding damage at the contact interface as occurred in conventional devices.

The metal barrier layer 212 can have a thickness less than a radius of the through hole 209 to prevent the metal barrier layer from blocking the through hole 209. The metal barrier layer 212 can be formed by, e.g., an electroless plating, to selectively form the metal barrier layer 212 on the metal surface of the columnar electrode 210.

During an exemplary electroless plating process, ultrasonic vibration can be used to prevent the electroless plating solution from forming bubbles in the through-hole without affecting formation of the metal barrier layer 212, when the electroless plating solution entering into the through hole 209. The ultrasonic vibration uses a frequency of about 20 KHz or greater.

During the exemplary electroless plating process, a pressure greater than 1 atm can be applied within an electroless plating chamber to render the electroless plating solution a pressure to facilitate an easy entering of the electroless plating solution into the through hole 209 without generating bubbles in the through hole.

Figure 13:
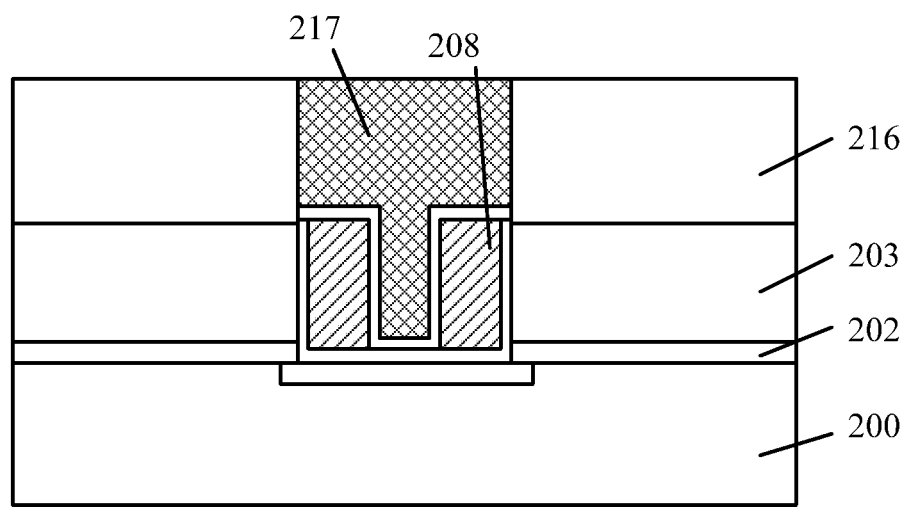

Referring to FIG. 13, a printing screen plate or a stainless steel plate (or mesh) 216 is disposed on surface of the first insulating layer 203. The printing screen plate or stainless steel plate 216 has a third opening to expose the bulk material 208 of the columnar electrode 210 and the through hole 209 (Step S28). Solder paste 217 is then filled into the third opening and the through-hole (Step S29).

The solder paste 217 can be formed by a screen-printing process and/or can be formed by a material including tin or tin alloy.

Figure 14:
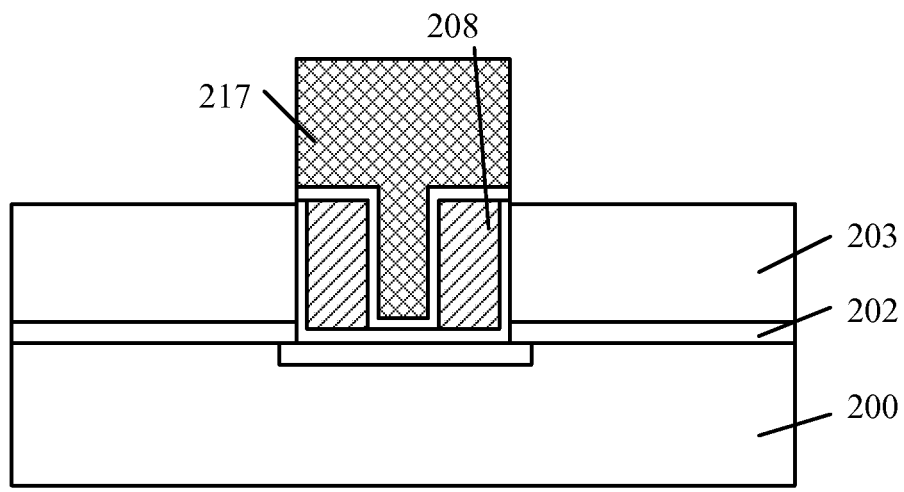

Referring to FIG. 14, the printing screen plate or stainless steel plate 216 is removed.

Figure 15:
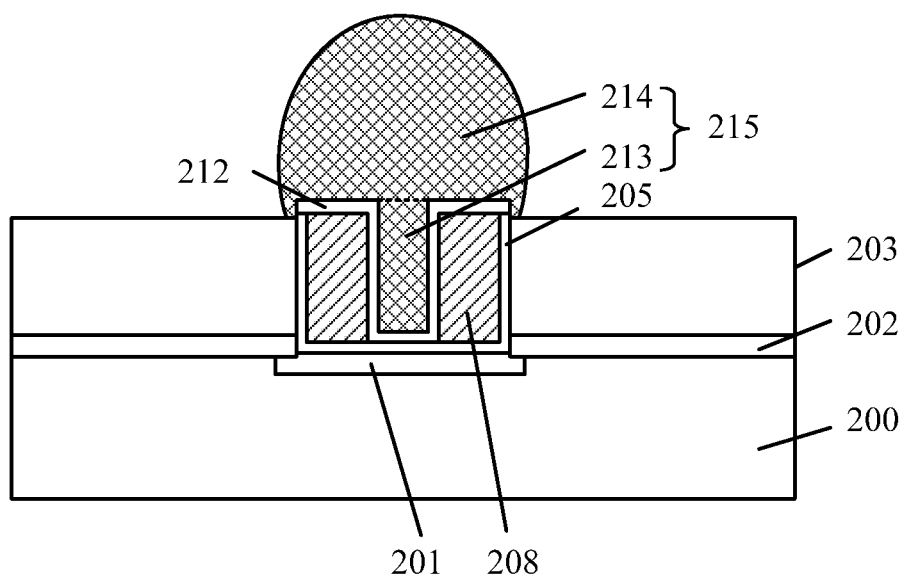

Referring to FIG. 15, the solder paste 217 can be processed by a reflow process to form a convex metal head 214 on top of the columnar electrode and to form filling part(s) 213 in the through hole(s) of the columnar electrode. The convex metal head 214 and the filling part(s) 213 constitute a solder ball 215. In an embodiment, the reflow process includes a heat treatment process.

In one embodiment, one through-hole can be included and, accordingly, one filling part 213 of the solder ball 215 can be formed. The solder ball and the columnar electrode constitute a bolt-like structure, which allows the contact between the solder ball and the columnar electrode from a conventional single plane surface contact into a multi-plane surface contact. When the solder ball is subjected to external forces, the increased contact area between the solder ball and the columnar electrode can share the exerted external forces, thereby enhancing the degree of adhesion/binding between the solder ball and the columnar electrode. The solder ball may bear greatly-enhanced external forces.

In other embodiments, when more than one through hole is included, more than one corresponding filling part of the solder ball can be formed. The filling part(s) of the solder ball can be inserted into through hole(s) in the bulk material of the columnar electrode to increase contact area between the solder ball and the columnar electrode. The solder ball and the columnar electrode can form a bolt-like structure having one or more bolt pins (e.g., filling parts) to improve adhesion/binding between the solder ball and the columnar electrode.

In addition, the filling parts in the through-holes can be distributed along a straight line, along a plurality of parallel lines, along intersecting lines, along concentric circles, along a concentric annular ring, along a polygonal shape, along a star shape, along a number of rays from the groove as a center, and/or distributed irregularly, such that the adhesion/binding between the solder ball and the columnar electrode can be uniform in all directions. The solder ball can bear greatly-enhanced external forces without falling off from the columnar electrode. In other embodiments, the solder ball 215 can be formed by a bump and reflow process.

An exemplary semiconductor device is provided as shown in FIG. 15. The exemplary semiconductor device can include: for example, a semiconductor substrate 200 having a plurality of solder pads 201 disposed thereon; a stacked structure on the semiconductor substrate 200, the stacked structure including a first insulating layer 203 disposed on a passivation layer 202, and the stacked structure including a first opening to expose one of the solder pads 201; a columnar electrode 210 disposed in the first opening, the columnar electrode including a bulk material and through hole(s) disposed through the bulk material, and the columnar electrode having a top surface flushed with or slightly above a top surface of the first insulating layer 203; a metal barrier layer 212 on sidewall and bottom of the through hole and on a top surface of the bulk material of the columnar electrode 210; a seed layer 205 disposed between the first opening and the columnar electrode; and/or a solder ball 215 disposed on the columnar electrode 210, the solder ball 215 including a convex metal head 214 on the columnar electrode 215 and a filling part 213 filled in each through hole.

One or more through-holes can be included. When one through-hole is included, one corresponding filling part 213 can be formed. The solder ball and the columnar electrode constitute a bolt-like structure to enhance degree of adhesion/binding between the solder ball and the columnar electrode. The solder ball may bear greatly-enhanced external forces.

The radius of the through hole and the width b of the bulk material of the columnar electrode 210 can range from about 1/10 to about 10/1, for example, from about 1:3 to about 3:1, such that the bulk material of the columnar electrode 210 has a desired width to ensure a mechanical strength and to provide sufficient contact area between the bottom surface of the columnar electrode and the underlying solder pad 201 and to maintain sufficient adhesion/binding there-between, while preventing gap formation between the bulk material of the columnar electrode and solder pad to avoid increased contact resistance or generation of disconnection. Conventional solder ball may have a fracture surface, which may be affected by the columnar electrode and may have multiple turnings with increased capability to absorbing destructive energy.

When more than one through-hole is included, more than one corresponding filling part 213 can be formed. The filling parts can be distributed along a straight line, along a plurality of parallel lines, along intersecting lines, along concentric circles, along a concentric annular ring, along a polygonal shape, along a star shape, along a number of rays from the groove as a center, and/or distributed irregularly. The filling parts of the solder ball can be inserted in the bulk material of the columnar electrode to increase contact area between the solder ball and the columnar electrode. In addition, the through-holes and the filling parts in the through holes can be orderly arranged such that the adhesion/binding between the solder ball and the columnar electrode is uniform in all directions. The solder ball can bear greatly-enhanced external forces without falling off from the columnar electrode.

Figure 16:
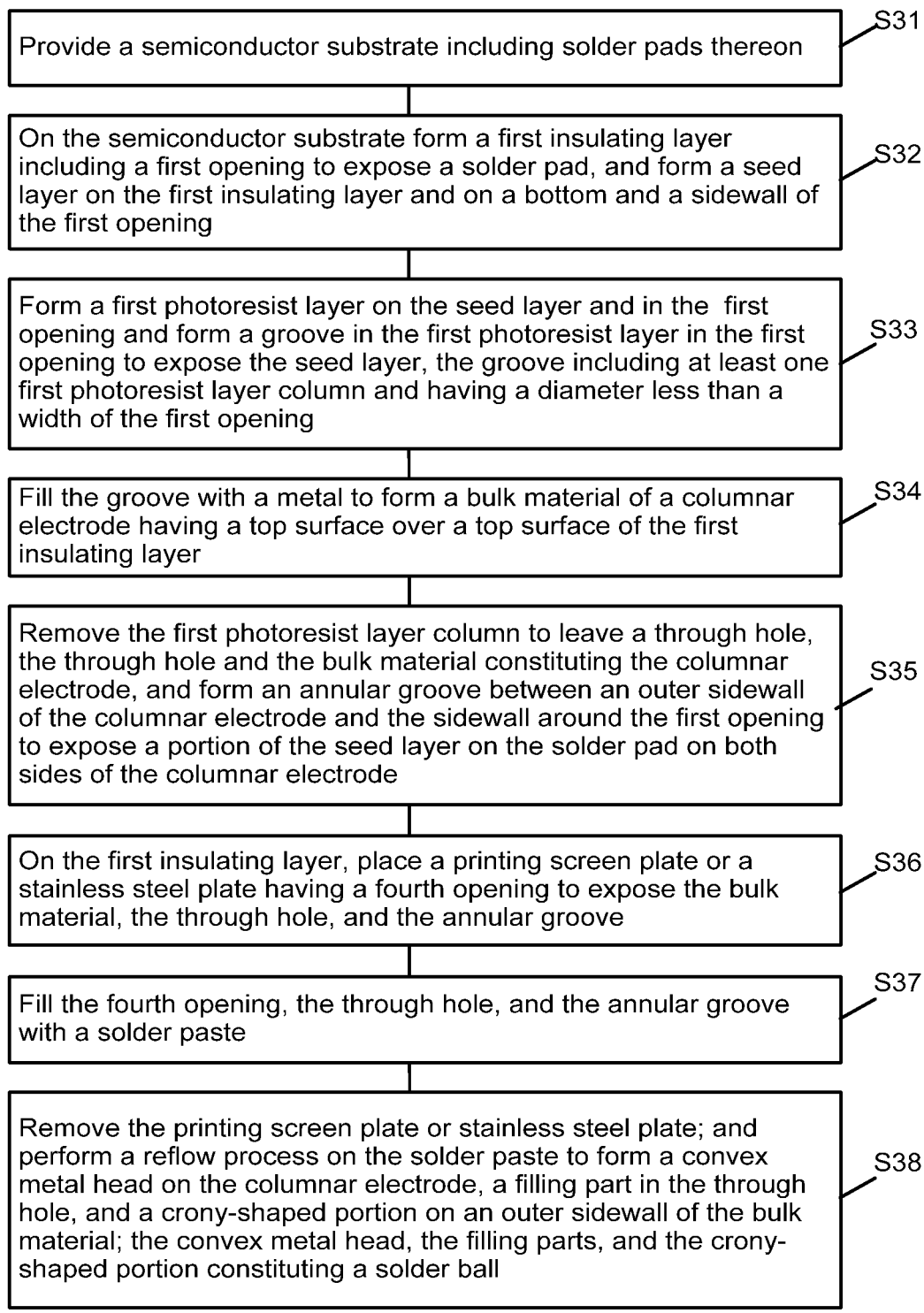
FIG. 16 illustrates a flowchart of another exemplary method for forming a semiconductor device consistent with the disclosed embodiments.

FIG. 16 illustrates a flowchart of another exemplary method for forming a semiconductor device consistent with the disclosed embodiments. FIGS. 17-28 illustrate an exemplary semiconductor device corresponding to certain stages during its formation in accordance with various disclosed embodiments. Note that similar or same processes/structures/parameters described in FIGS. 2-15 may be used for the embodiments depicted in FIGS. 16-28 with or without repeated description.

Figure 17:
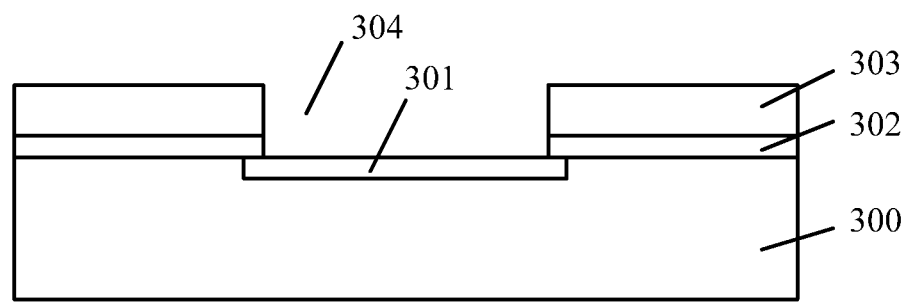
FIGS. 17-28 illustrate an exemplary semiconductor device corresponding to certain stages during its formation in accordance with various disclosed embodiments.
Figure 18:
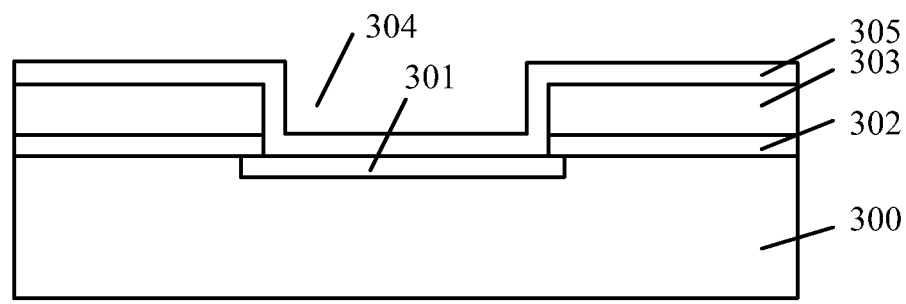

Referring to FIGS. 17-18, a semiconductor substrate 300 is provided having a plurality of solder pads 301 formed thereon (Step S31). On the semiconductor substrate 300, a stacked structure, including a first insulating layer 303 formed on a passivation layer 302, is formed to have a first opening 304 to expose a surface of the solder pad 301. A seed layer 305 is formed on sidewall and bottom surface of the first opening 304 and on surface of the first insulating layer 303 (Step S32). The structures and their formation shown in FIGS. 17-18 can be the same or similar to corresponding portions as depicted in FIGS. 2-15.

Figure 19:
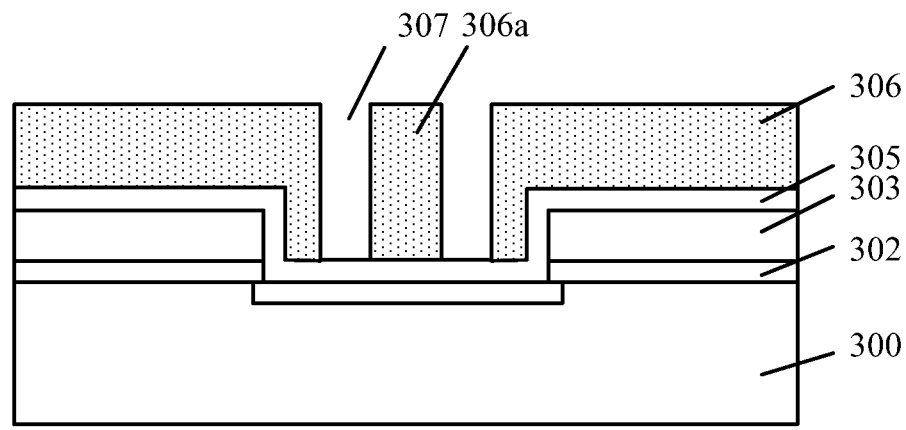

Referring to FIG. 19, a first photoresist layer 306 is formed on surface of the seed layer 305 to fill up the first opening 304. A groove 307 that exposes a surface portion of the seed layer 305 is formed through a portion of the first photoresist layer 306 in the first opening 304. The groove 307 includes at least one first photoresist layer column 306a. The groove 307 has a diameter smaller than a width of the first opening 304, e.g., an outer sidewall of the groove 307 is within the first opening 304 (Step S33).

In one embodiment, the groove 307 has a diameter smaller than the width of the first opening 304, such that the outer sidewall of the groove 307 is within the first opening 304 and distanced from the sidewall of the first opening 304 (formed by the seed layer 303) by a portion of first photoresist layer 306. In this manner, a bulk material of a columnar electrode that is subsequently formed in the groove 307, after removing the first photoresist layer 306, can have an outer sidewall. Between the outer sidewall of the bulk material of the columnar electrode and the sidewall of the first opening 304 can form an annular groove. When forming a solder ball, an L-type skirt-shaped part of the solder ball can thus be formed.

One or more first photoresist layer columns 306a can be included in the groove 307. Arrangements of the first photoresist layer columns 306a can be the same or similar to the arrangement of the first photoresist layer columns as described in FIGS. 2-15.

Figure 20:
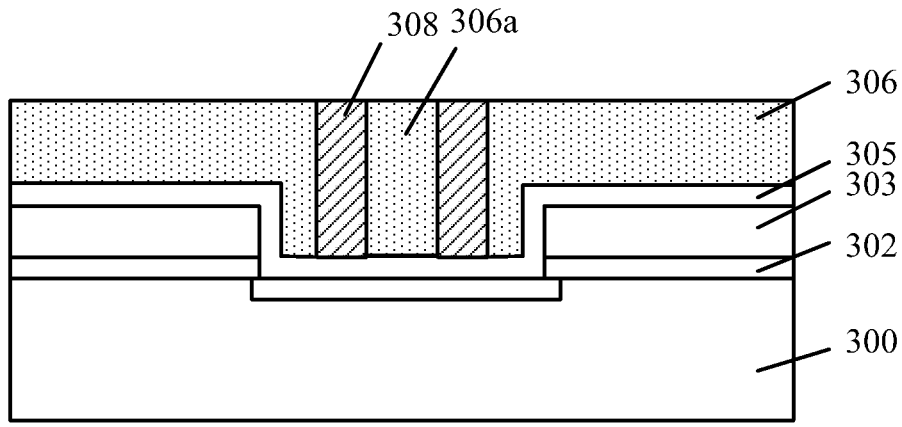

Referring to FIG. 20, an electroplating process can be used to fill metal in the groove 307 to form a bulk material 308 of a columnar electrode 310 (Step S34). The bulk material 308 of the columnar electrode 310 can have a top surface higher than a top surface of the first insulating layer 303.

Figure 21:
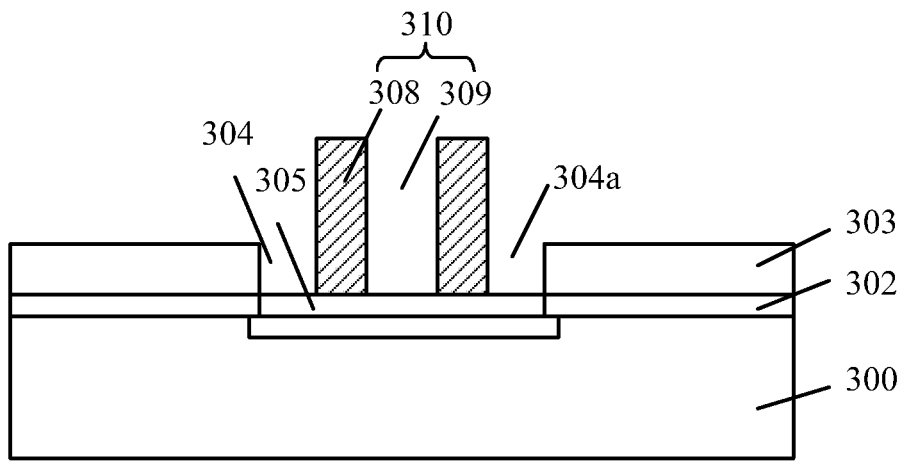
Figure 22:
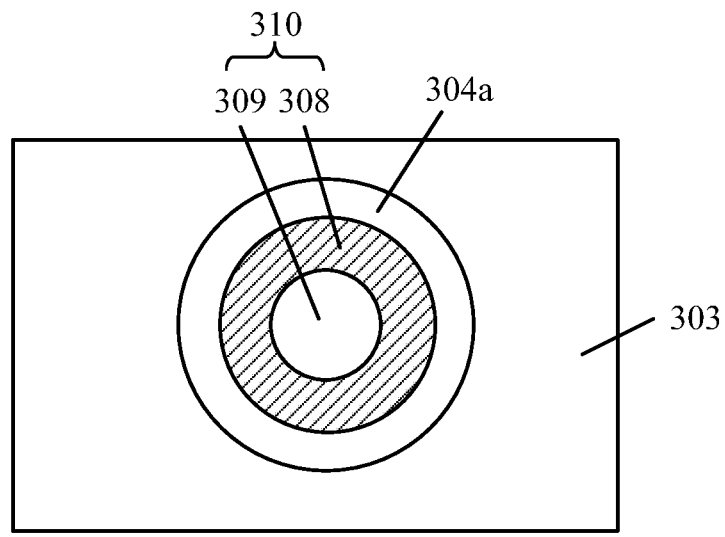

Referring to FIGS. 21-22, FIG. 22 shows a top view of the structure shown in FIG. 21. As shown in FIG. 21, the first photoresist layer column 306a and the first photoresist layer 306 outside of the bulk material 308 of the columnar electrode 310 is removed to leave a through hole 309 at a corresponding position of the first photoresist layer column 306a after its removal. The through hole 309 and bulk material 308 constitute the columnar electrode 310. Meanwhile, an annular groove 304a (or annularly-etched groove) is formed between an outer sidewall of the columnar electrode 310 and the sidewall around the first opening 304. The annular groove 304a is a part of the first opening 304 to expose a portion of the seed layer 305 on the solder pad 301 that is on both sides of the columnar electrode 310 (Step S35). As shown in FIG. 21, a portion of the seed layer 305 is removed from the top surface of the first insulating layer 303 outside of the first opening 304 and/or from sidewall of the first opening 304 to leave a remaining seed layer 305.

In other embodiments, a portion of the seed layer on the sidewall of the first opening can be retained or partially on the surface of the first insulating layer 303. When subsequently the metal barrier layer is selectively formed, the metal barrier layer formed in the annular groove can have a "U" shape. On surface the "U" shaped metal barrier layer, solder paste can be filled in. During a reflow process, the solder paste and the "U" shaped metal barrier layer can be in contact with each other, e.g., at three surfaces. Absorption forces at the interface between the solder paste and the metal barrier layer (e.g., mainly the metal barrier layer on sidewall of the first opening) can at least partially offset surface tension forces of the solder paste. During the reflow process, an L-type skirt shape part can be formed on the outer sidewall of the bulk material.

Figure 23:
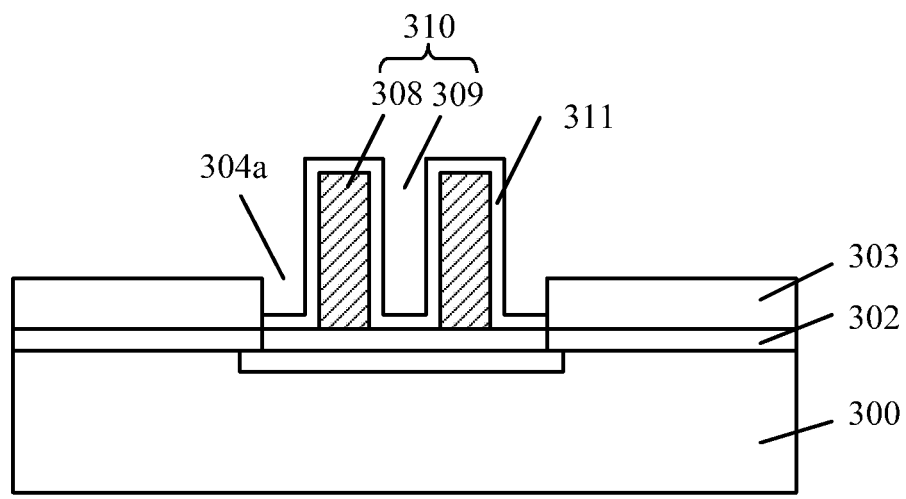

Referring to FIG. 23, a metal barrier layer 311 is formed on surface (including surfaces of inner sidewall and outer sidewall) of the bulk material 308 of the columnar electrode 310 and on surface of the remaining seed layer 305. The metal barrier layer 311 can be formed similar to the formation of the metal barrier layer as depicted in FIGS. 2-15.

Figure 24:
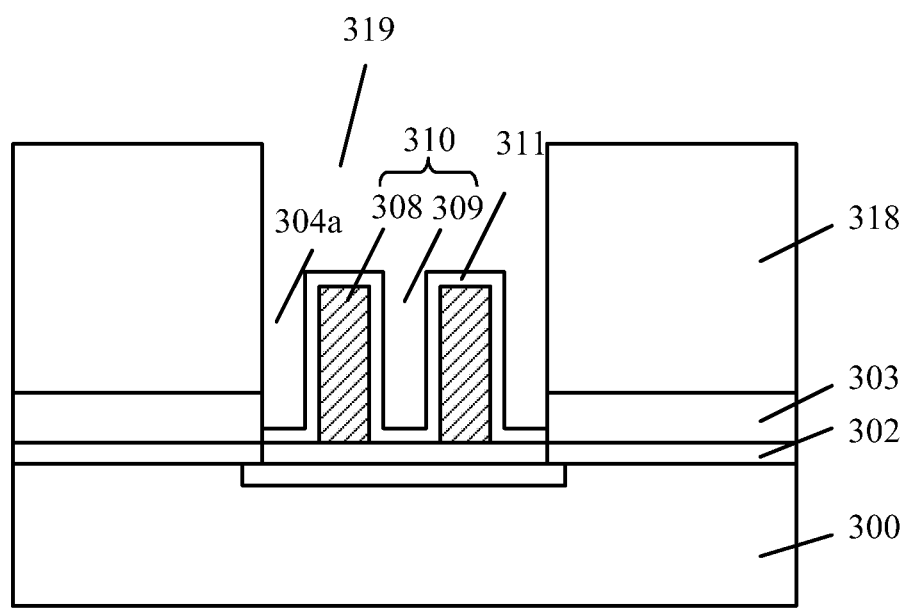
Figure 25:
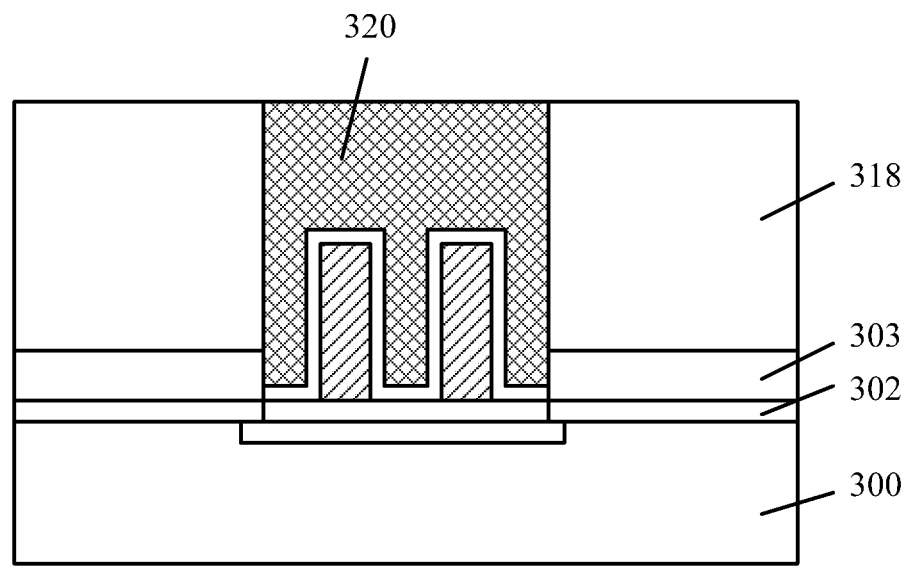
Figure 26:
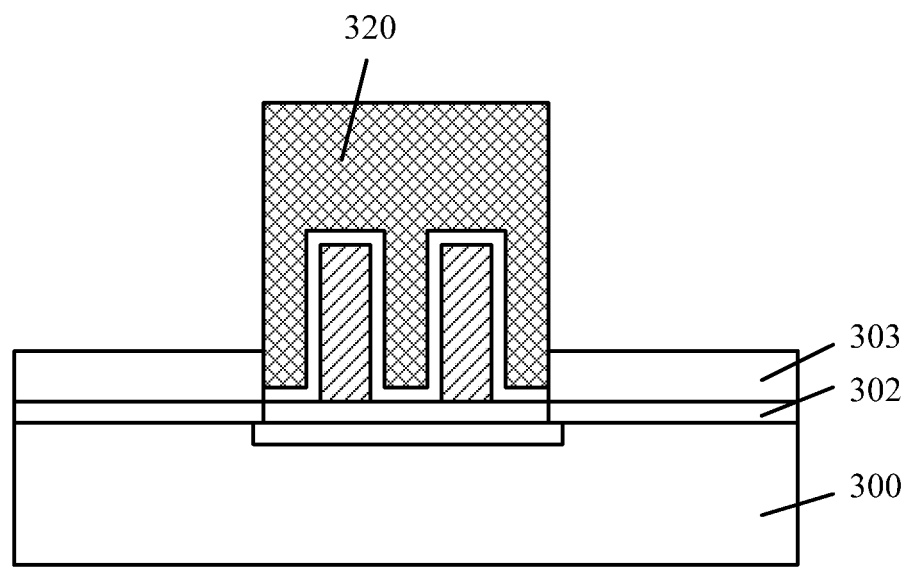

Referring to FIG. 24 to FIG. 26, a printing screen plate or a stainless steel plate 318 is placed on surface of the first insulating layer 303. The printing screen plate or stainless steel plate 318 can include a fourth opening 319 to expose the columnar electrode 310, including the through hole 309 and the bulk material 308, and the annular groove 304a (Step S36). Solder paste 320 can then fill the fourth opening 319, the through holes 309, and the annular groove 304a as shown in FIG. 25 (Step S37). The printing screen plate or stainless steel plate 318 can then be removed as shown in FIG. 26.

Figure 27:
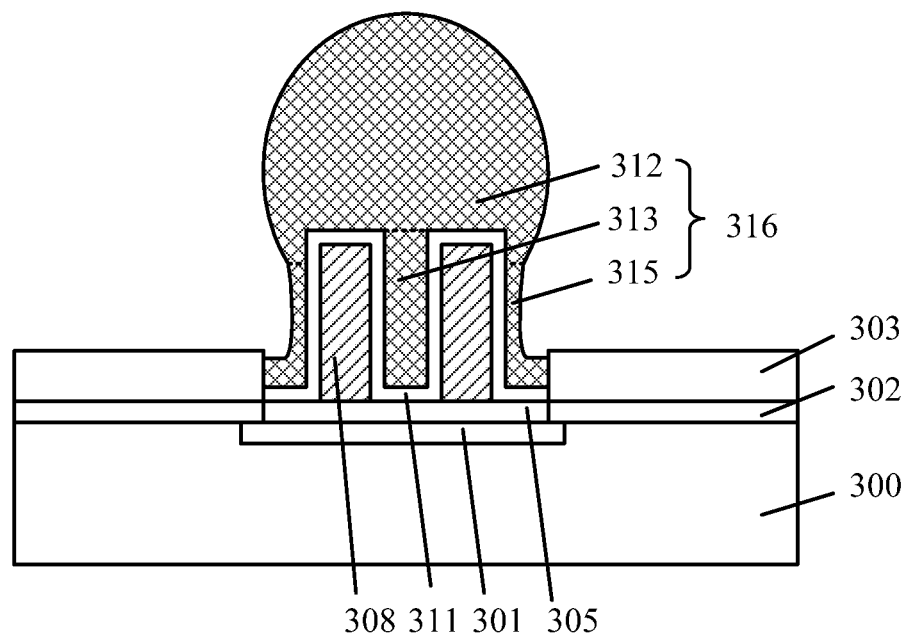

Referring to FIG. 27, the solder paste 320 then undergoes a reflow process to form a convex metal head 312 on the top of the columnar electrode, to form filling parts 313 in the through holes, and to form a skirt-shaped part 315 on an outer sidewall of the bulk material 308 of the columnar electrode.

Figure 28:
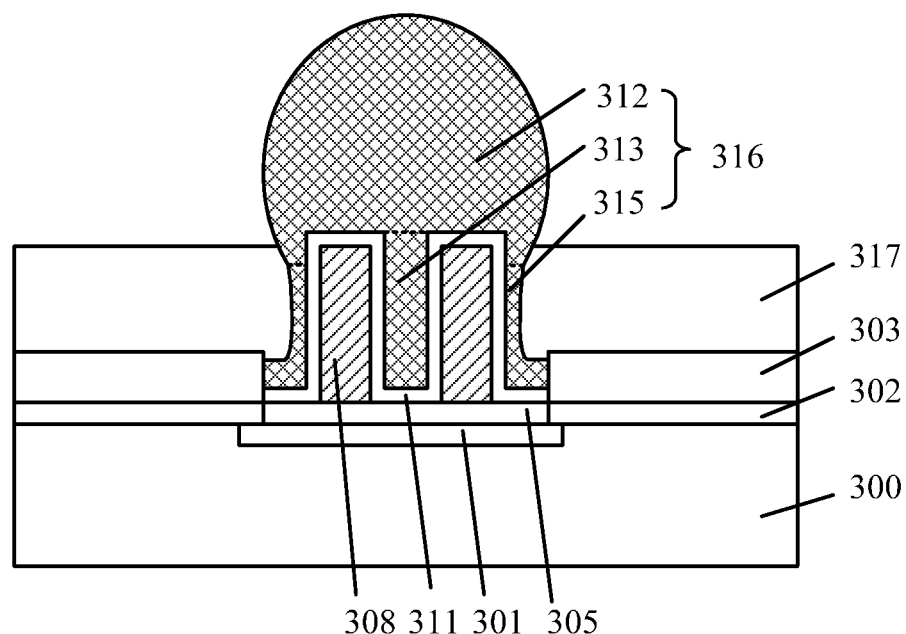

The skirt-shaped part 315 can have an upper portion connected to the bottom portion of the convex metal head 312. The skirt-shaped part 312 can have a lower portion electrically connected to the solder pad 301 on both sides of columnar electrode 310 (or connected to the metal barrier layer 311 on the solder pad 301 on both sides of columnar electrode 310) and also in contact with the sidewall of the first opening. The lower portion of the skirt-shaped part 315 can have a width greater than the upper portion of the skirt-shaped part 315. The lower portion of the skirt-shaped part 315 can have a surface higher than, lower than, or leveled (flushed) with a top surface of the first insulating layer 303. The convex metal head 312, the filling parts 313, and the skirt-shaped part 315 constitute a solder ball 316 as shown in FIG. 28 (Step S38).

During the reflow process, the convex metal head 312 is formed by the solder paste under the surface tension on top surface of the columnar electrode. The top surface of the columnar electrode is higher than the top surface of the first insulating layer 303. The solder paste on the middle part of the outer sidewall of the bulk material 308 is in contact with the sidewall of the bulk material 308 with only one surface and part of the solder paste may flow in a direction toward the convex metal head under the surface tension action. The solder paste within the annular groove at the lower part of the outer sidewall of the bulk material 308 can be respectively in contact with three surfaces including a surface of sidewall of the first opening, the metal barrier layer 311 on the upper portion of the outer sidewall the bulk material 308, and the metal barrier layer 311 on surface of the lower portion of the solder pad 301. During a reflow process, absorption forces at the contact area between the sidewall of the first opening and the solder paste within the annular groove can offset some surface tension of the solder paste within the annular groove in a direction pointing to the bulk material of the columnar electrode.

Absorption forces at the contact area between a portion of the metal barrier layer 311 over the solder pad 301 and the solder paste within the annular groove can offset some tension of the solder paste within the annular groove in a direction pointing to the convex metal head 312, such that the L-type skirt-shaped part 315 is formed on the outer sidewall of the bulk material 308. The L-type skirt-shaped part 315 can have a lower portion with a thickness from the underlying seed layer 305 corresponding to a thickness of the first insulating layer 303. For example, the lower portion of the skirt-shaped part 315 can have a thickness less than or equal to or the thickness of the first insulating layer 303.

Compared with the solder ball 215 in FIGS. 2-15, the solder ball 316 in FIG. 27 further includes a skirt-shaped part 315, which allows the solder ball 316, in addition to contacting a top surface and an inner sidewall surface of the bulk material, to be in contact with the outer sidewall surface of the bulk material. The solder ball can thus have further increased contact area with the columnar electrode. When subjected to external forces, the external forces exerted on such solder ball can be further distributed along the contact area to improve the degree of adhesion/binding between the solder ball and the columnar electrode.

The L-type skirt-shaped part 315 can be in contact with the sidewall of the first opening, a portion of the metal barrier layer 311 on sidewall of the bulk material 308, and a portion of the metal barrier layer 311 over the solder pad 301. The L-type skirt-shaped part 315 can have the lower portion wider than the upper portion, which can be considered as a support frame. The L-type skirt-shaped part can allow the solder ball to bear greatly-enhanced lateral external forces to have a highly acceptable external force. The solder ball is then more difficult to be detached from the columnar electrode.

Referring to FIG. 28, a second insulating layer 317 is formed on surface of the first insulating layer 303 and on surface of the skirt-shaped part 315 of the solder ball.

The second insulating layer 317 can be used for sealing and insulation to prevent water vapor and oxygen from entering into the solder pad 301 and the columnar electrode, and from causing corrosion. The second insulating layer 317 can be made of, e.g., polybenzoxazole (PBO), polyimide, and/or other suitable organic resins.

In various embodiments, a semiconductor device can be formed to include, e.g., a semiconductor substrate 300, a plurality of solder pads 301 formed on the semiconductor substrate 300, a stacked structure on the semiconductor substrate 300, the stacked structure including a first insulating layer 303 disposed on a passivation layer 302, and the stacked structure including a first opening to expose one of the solder pads 201; and a columnar electrode 210 disposed in the first opening, the columnar electrode including a bulk material and through hole(s) disposed through the bulk material, and the columnar electrode having a diameter less than a width of the first opening and a top surface above a top surface of the first insulating layer 203. A solder ball 316 can be formed on the columnar electrode, the solder ball 316, can include: a convex metal head 312 on top surface of the columnar electrode, filling part(s) 313 filled in the through hole, and a skirt-shaped part 315 on outer sidewall of the bulk material 308 of the columnar electrode.

The skirt-shaped part 315 can have an upper portion connected to the bottom portion of the convex metal head 312. The skirt-shaped part 312 can have a lower portion electrically connected to the solder pad 301 on both sides of columnar electrode 310 (or connected to the metal barrier layer 311 on the solder pad 301 on both sides of columnar electrode 310) and also in contact with the sidewall of the first opening. The lower portion of the skirt-shaped part 315 can have a width greater than the upper portion of the skirt-shaped part 315. The lower portion of the skirt-shaped part 315 can have a surface higher than, lower than, or leveled (flushed) with a top surface of the first insulating layer 303.

The semiconductor device can include: a metal barrier layer 311 located between the solder ball 316 and the bulk material of the columnar electrode; and a seed layer located between the columnar electrode and the solder pad 301.

Figure 29:
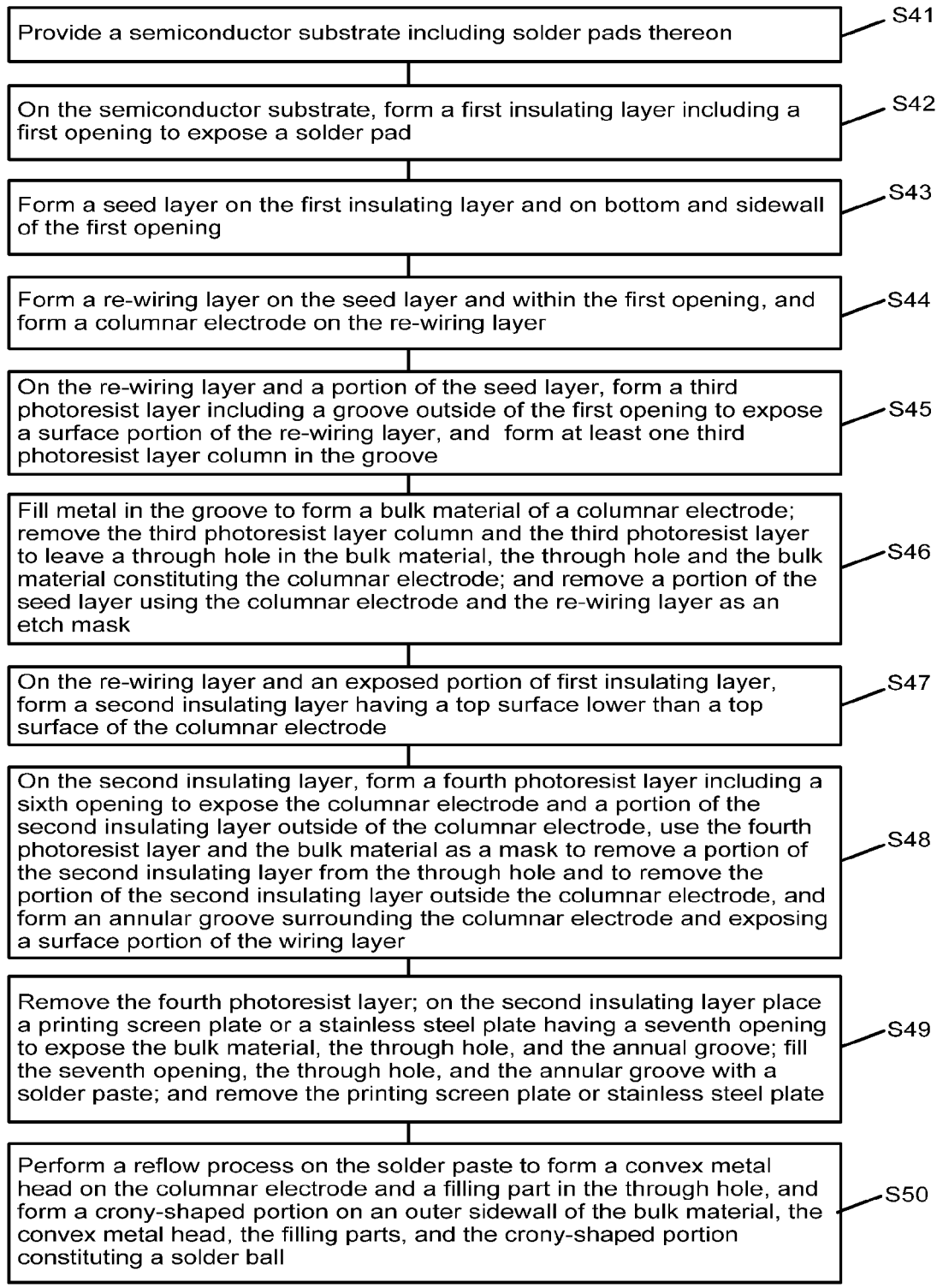

FIG. 29 illustrates a flowchart of another exemplary method for forming a semiconductor device consistent with the disclosed embodiments. FIGS. 30-40 illustrate an exemplary semiconductor device corresponding to certain stages during its formation in accordance with various disclosed embodiments. Note that similar or same processes/structures/parameters described in FIGS. 2-15 and FIGS. 16-28 may be used for embodiments depicted in FIGS. 29-40 with or without repeated description.

Figure 30:
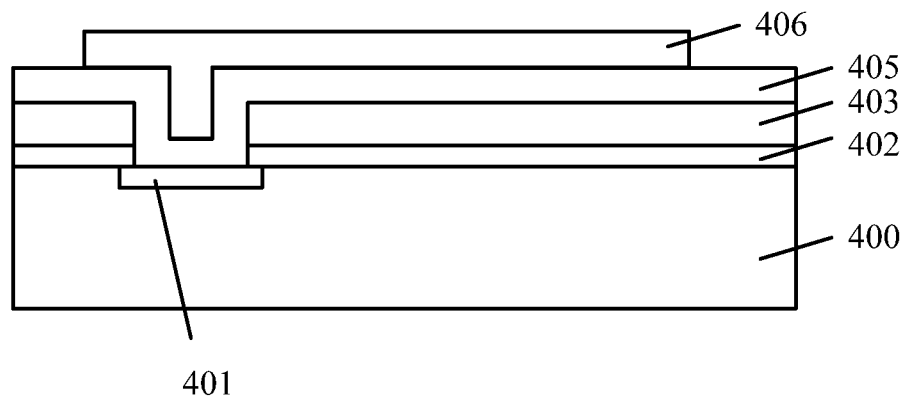

Referring to FIG. 30, a semiconductor substrate 400 is provided. A plurality of solder pads 401 are formed on the semiconductor substrate 300 (Step S41). A stacked structure is formed on the semiconductor substrate 300. The stacked structure can include a first insulating layer 403 disposed on a passivation layer 402, the stacked structure including a first opening to expose one of the solder pads 401 (Step S42). A seed layer 405 is formed on sidewall and bottom of the first opening and on surface of the first insulating layer (Step S43). A re-wiring layer 406 is formed within the first opening and formed on a first surface portion of the seed layer 405.

The re-wiring layer 406 can be formed by an electroplating process. A columnar electrode is subsequently formed on surface of the re-wiring layer 406 (Step S44). Compared with directly forming the columnar electrode on the surface of the solder pad, formation of the re-wiring layer 406 can facilitate improvement of packaging density.

Figure 31:
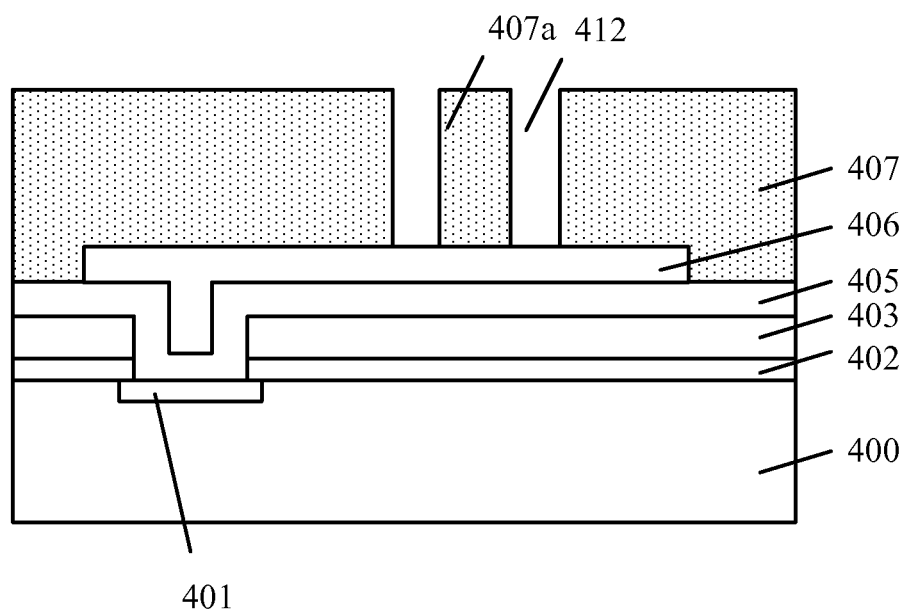

Referring to FIG. 31, a third photoresist layer 407 is formed on the re-wiring layer 406 and a second surface portion of the seed layer 405. The third photoresist layer 407 can include a groove 412 outside of the first opening to expose a surface portion of the re-wiring layer 406. At least one third photoresist layer column 407a is formed in the groove 412 (Step S45). The at least one third photoresist layer column 407a can be arranged the same or similar to the first photoresist layer column(s) as disclosed herein. The arrangement of the groove 412 in the third photoresist layer column 407a can be the same as discussed above in FIGS. 2-15.

Figure 32:
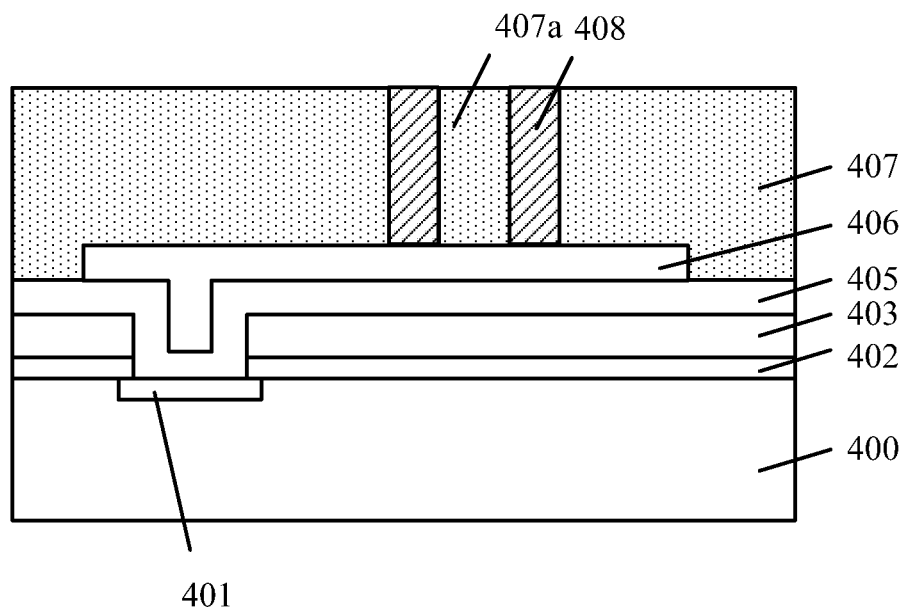
Figure 33:
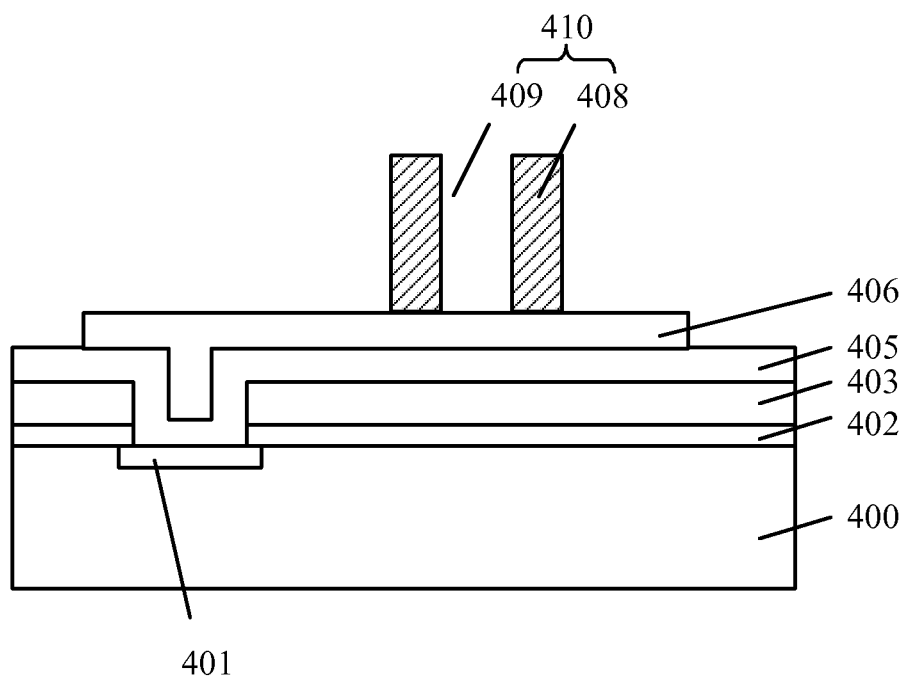

Referring to FIG. 32 and FIG. 33, a bulk material 408 of a columnar electrode is formed by filling metal in the groove 412, e.g., using an electroplating process, followed by removing the third photoresist layer column 407a and the third photoresist layer 407 outside of the bulk material 408, leaving a through hole 409 at a position corresponding to the third photoresist layer column 407a. The formed through hole 409 and the bulk material 408 constitute a columnar electrode 410.

Figure 34:
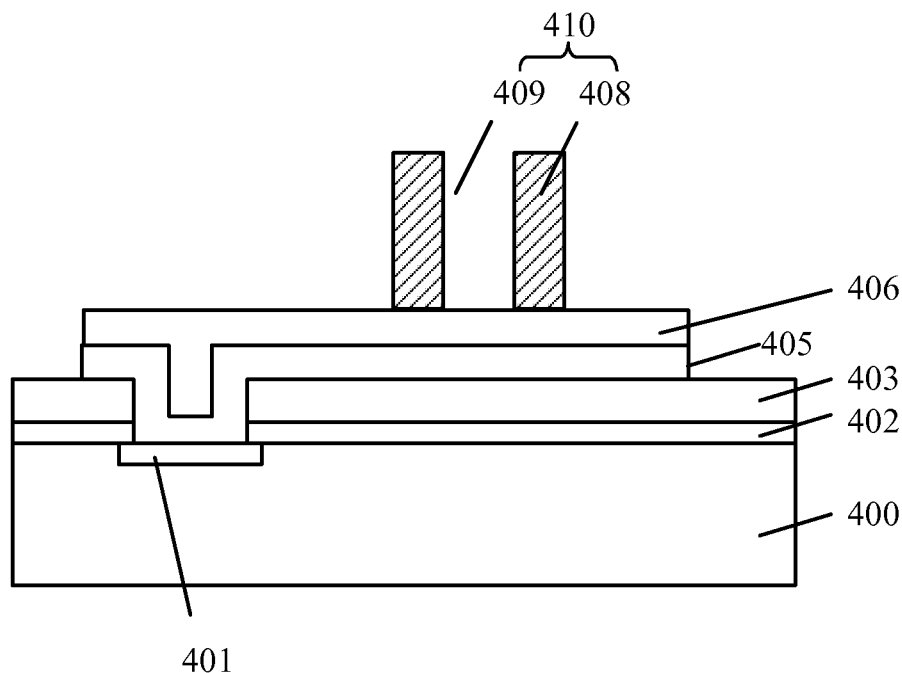

Referring to FIG. 34, the second portion of the seed layer 405 is removed using the columnar electrode 410 and the re-wiring layer 406 as an etch mask (Step S46).

In one embodiment, the columnar electrode 410 is formed before forming the second insulating layer and after forming the seed layer, followed by forming the re-wiring layer and the columnar electrode. The seed layer can be used as a power supply line for forming the re-wiring layer and the columnar electrode, followed by the removal of the portion of the seed layer.

Figure 35:
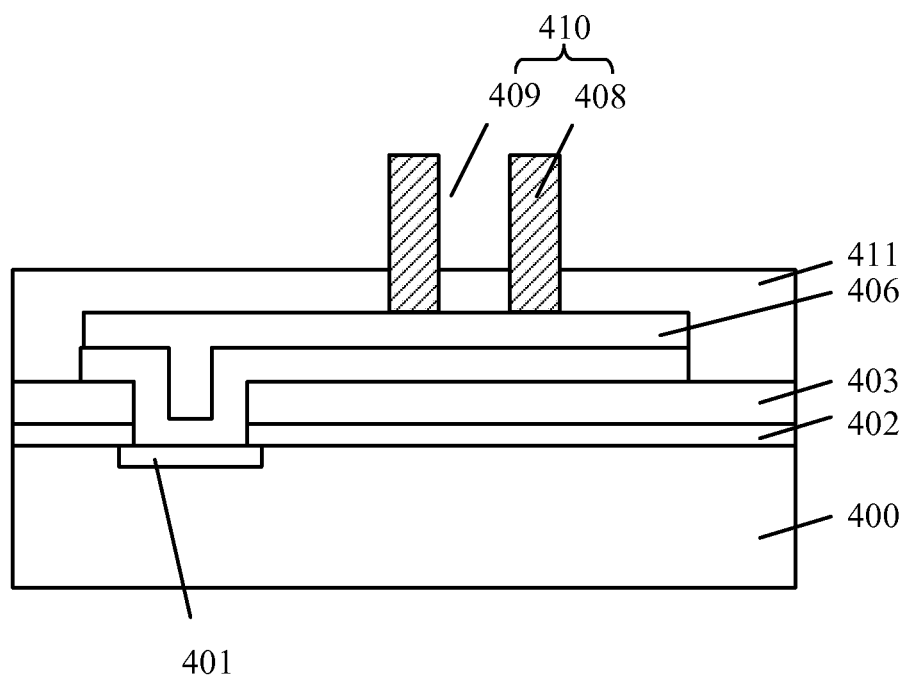

Referring to FIG. 35, a second insulating layer 411 is formed on surface of the re-wiring layer 406 and on an exposed portion of first insulating layer 403. The second insulating layer 411 has a top surface lower than a top surface of the columnar electrode 410 (Step S47).

When the second insulating layer 411 has a top surface lower than the top surface of the columnar electrode 410, a portion of the second insulating layer 411 outside of the bulk material of the columnar electrode is subsequently removed to form an annular groove. An L-type skirt-shaped part can be formed on the outer sidewall of the bulk material. A solder ball including a convex metal head, a filling part and a skirt-shaped part can then be formed.

In other embodiments, the second insulating layer can have a surface flushed with or slightly below a top surface of the columnar electrode to subsequently form a filling part, and a skirt-shaped part of the solder ball.

Figure 36:
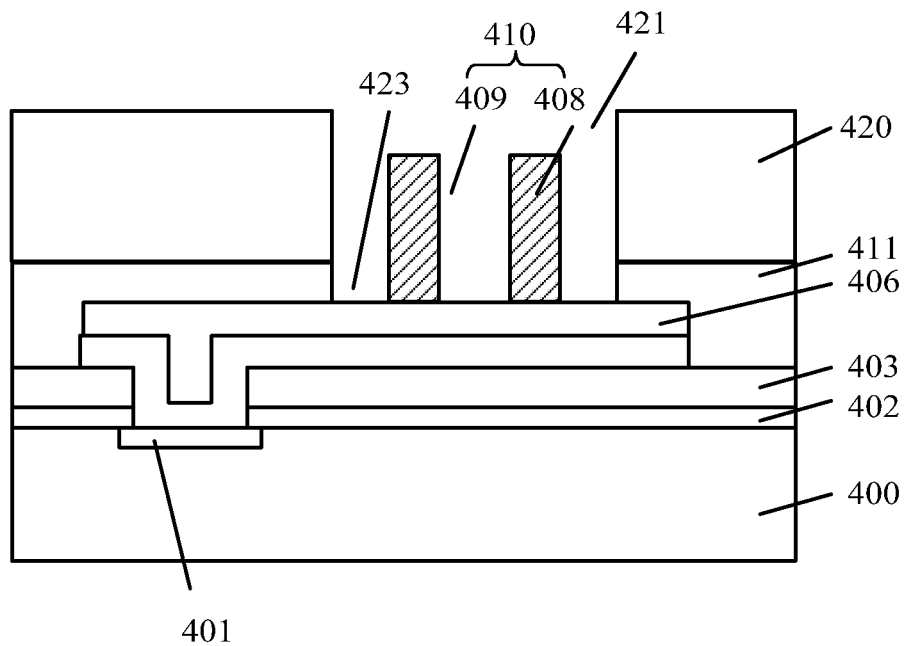

Referring to FIG. 36, a fourth photoresist layer 420 is formed on surface of the second insulating layer 411. The fourth photoresist layer 420 includes a sixth opening 421 to expose the columnar electrode 410 and a portion of the second insulating layer 411 outside of the columnar electrode 410 as shown in FIG. 36. The fourth photoresist layer 420 and the bulk material of the columnar electrode 410 can be used as a mask to remove a portion of the second insulating layer from the through hole 409 and to remove the portion of the second insulating layer outside of the columnar electrode 410. An annular groove 423 is thus formed surrounding the columnar electrode 410 and exposing a surface portion of the wiring layer 406 (Step S48).

In other embodiments, when forming the second insulating layer having a surface flushed with the top surface of the columnar electrode, the second insulating layer is formed on the re-wiring layer and a surface portion of the first insulating layer and having a surface flushed with the top surface of the columnar electrode. A fourth photoresist layer can be formed on surface of the second insulating layer. The fourth photoresist layer can have a fifth opening to expose the columnar electrode. The fourth photoresist layer and the bulk material of the columnar electrode can be used as an etch mask to remove a portion of the second insulating layer from the through hole.

The fourth photoresist layer can be removed. A printing screen plate or a stainless steel plate can be disposed on surface of the first insulating layer. The printing screen plate or the stainless steel plate can include an eighth opening to expose the bulk material of the columnar electrode and the through hole. Solder paste can be filled in the eighth opening and the through-hole, followed by removal of the printing screen plate or the stainless steel plate. The solder paste can then undergo a reflow process to form a convex metal head on top of the columnar electrode and to form a filling part in the through hole. The convex metal head and the filling part constitute a solder ball.

Figure 37:
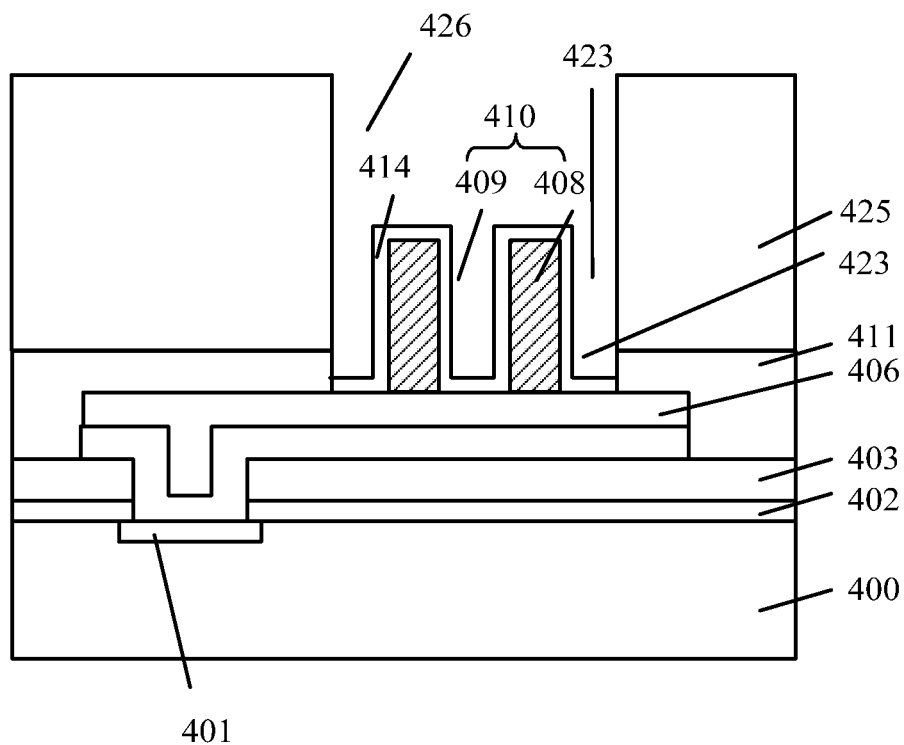

Referring to FIG. 37, a metal barrier layer 414 is formed on top surface, outer sidewall surface, and inner sidewall surface of the bulk material 408 of the columnar electrode, and also on a surface portion of the re-wiring layer 406. The fourth photoresist layer is then removed. A printing screen plate or a stainless steel plate 425 is disposed on surface of the second insulating layer 411. The printing screen plate or stainless steel plate 411 can include a seventh opening 426 to expose the bulk material 408 of the columnar electrode, the through hole 409, and the annular groove 423.

Figure 38:
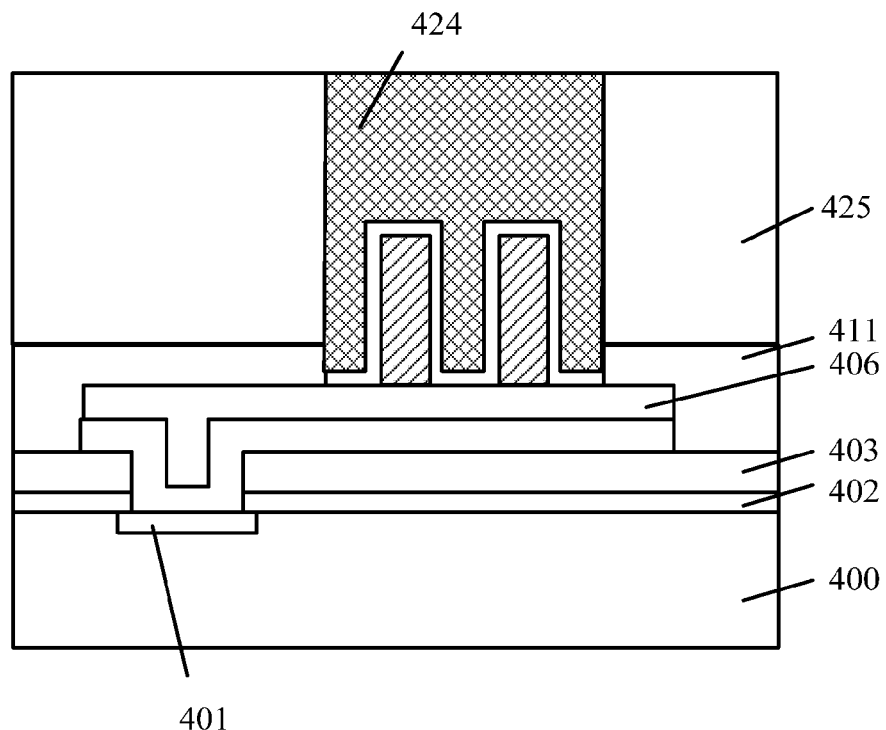
Figure 39:
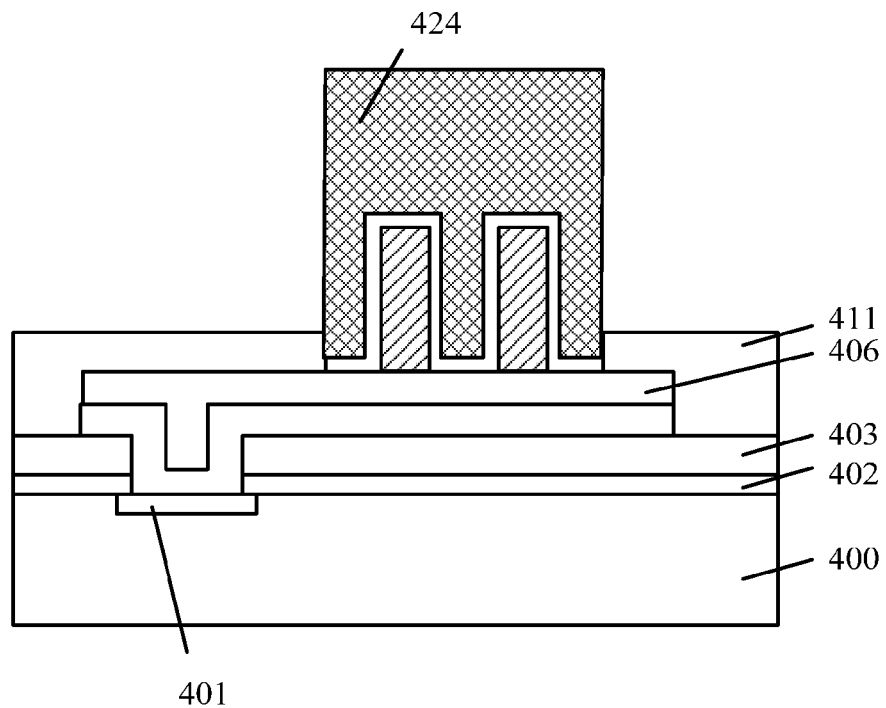

Referring to FIG. 38 and FIG. 39, solder paste 424 is filled in the seventh opening 426, the through holes 408, and the annular groove 423, followed by removing the printing screen plate or stainless steel plate 425 (Step S49).

Figure 40:
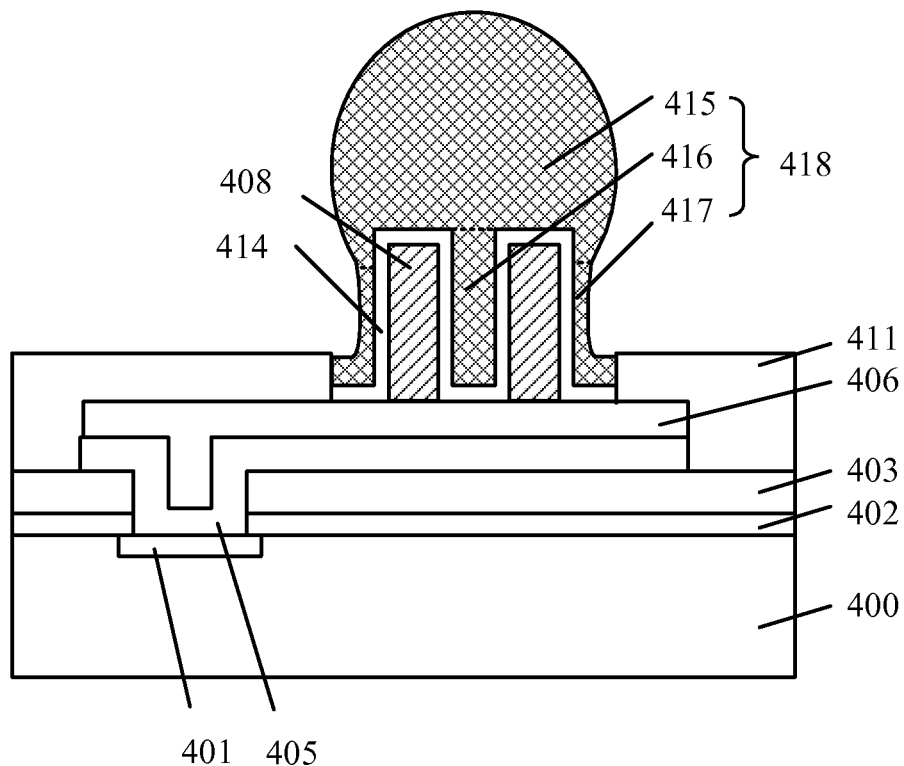

Referring to FIG. 40, the solder paste undergoes a reflow process to form a convex metal head 415 on top of the columnar electrode, to form a filling part 416 in the through hole, and to form an L-type skirt-shaped part 417 the outer sidewall of the bulk material 408 of the columnar electrode.

The L-type skirt-shaped part 417 can have an upper portion connected to a lower portion of the convex metal head 415. The L-type skirt-shaped part 417 can have a lower portion connected to a portion of the re-wiring layer 406 on both sides of the columnar electrode and connected to the sidewall of the annular groove. The L-type skirt-shaped part 417 can have the lower portion with a width greater than a width of the upper portion. The L-type skirt-shaped part 417 can have the lower portion with a surface above, below, or flushed with a surface of the second insulating layer 411. A solder ball 418 can be formed to include the convex metal head 415, the filling part 416, and the L-type skirt-shaped part 417 (Step S50).

Referring to FIG. 40, an exemplary semiconductor device 400 can include, e.g., a semiconductor substrate 400; a plurality of solder pads 401 formed on the semiconductor substrate 400; a stacked structure on the semiconductor substrate 400, the stacked structure including a first insulating layer 403 disposed on a passivation layer 402, and the stacked structure including a first opening to expose one of the solder pads 401; and a seed layer 405 located on sidewall and bottom of the first opening and on a surface portion of the first insulating layer.

A re-wiring layer 406 is formed on surface of the seed layer 405 and fills up the first opening. A second insulating layer 411 is disposed on the re-wiring layer 406 and on a surface portion of the first insulating layer 403. The second insulating layer 411 has a second opening to expose a surface portion of the first wiring layer 406 outside of the first opening. A columnar electrode is formed within the second opening and on the re-wiring layer 406. The columnar electrode includes a bulk material 408 and through holes through the bulk material 408. The columnar electrode has a diameter less than a width of the second opening. An annular groove is formed between the columnar electrode and the sidewall of the second opening. The columnar electrode has a top surface above the top surface of the second insulating layer 411. A solder ball 418 is located on the columnar electrode and includes: a convex metal head 415 on top of the columnar electrode, a filling part 416 filled in the through hole, and a skirt-shaped part 417 formed on the outer sidewall of the bulk material 408 of the columnar electrode. The skirt-shaped part 417 can have an upper portion connected to the convex metal head 415. The skirt-shaped part 417 can have a lower portion connected to a portion of the re-wiring layer 406 on both sides of the columnar electrode and contacted with the sidewall of the second opening. The skirt-shaped part 417 can have the lower portion with a width greater than a width of the upper portion. The skirt-shaped part 417 can have a lower portion with a surface below, above, or flushed with a surface of the second insulating layer 411. A metal barrier layer 414 can be formed between the solder ball 418 and the bulk material 408 of the columnar electrode.

In this manner, a semiconductor device can be formed by forming a columnar electrode. The columnar electrode can include a bulk material and through-holes through the bulk material. The solder ball can include a convex metal head on the top surface of the columnar electrode and a filling part filled in the through hole. The solder ball and the columnar electrode can form a bolt-like structure. The solder ball can be in contact with not only the top surface of the columnar electrode and also inner surfaces of the columnar electrode. Contact between the solder ball and the columnar electrode can be improved from a single plane surface to multiple plane surfaces.

When subjected to external forces, the external forces exerted on such solder ball can be further distributed due to the increased contact area (e.g., between the solder ball and the top surface of the columnar electrode; and between the solder ball and the inner/outer sidewalls the bulk material of the columnar electrode) to improve the degree of adhesion/binding between the solder ball and the columnar electrode. The solder ball can thus bear greatly-enhanced lateral external forces compared with conventional solder ball structure. The disclosed solder ball is then more difficult to be detached from the columnar electrode.

In various embodiments, the bulk material of the columnar electrode can include a plurality of engraved seams for dividing the bulk material to include a plurality of sub-bulk materials distributed with equal angular distribution. And the filing parts can further fill the plurality of engraved seams between adjacent sub-bulk materials.

As disclosed herein, each element of the exemplary semiconductor devices can have desired dimensions, shapes, configurations, etc. In an exemplary semiconductor device, a columnar electrode on a solder ball can include a bulk material and a plurality of protruded parts disposed on perimeter sidewall of the bulk material to greatly enhance surface area of the columnar electrode. In one embodiment, the protruded parts can be sub-bulk materials or can include independent parts other than the bulk material. The solder ball on the columnar electrode includes a convex metal head located on top of the columnar electrode and a skirt-shaped part located on surface of the protruded parts, such that contact area between the solder ball and the columnar electrode is increased and thus adhesion/binding therebetween is enhanced. The solder ball may bear greatly-enhanced external forces and may not be detached from the columnar electrode. In various embodiments, the columnar electrode may include through holes to be filled by filling parts from the solder ball.

Figure 41:
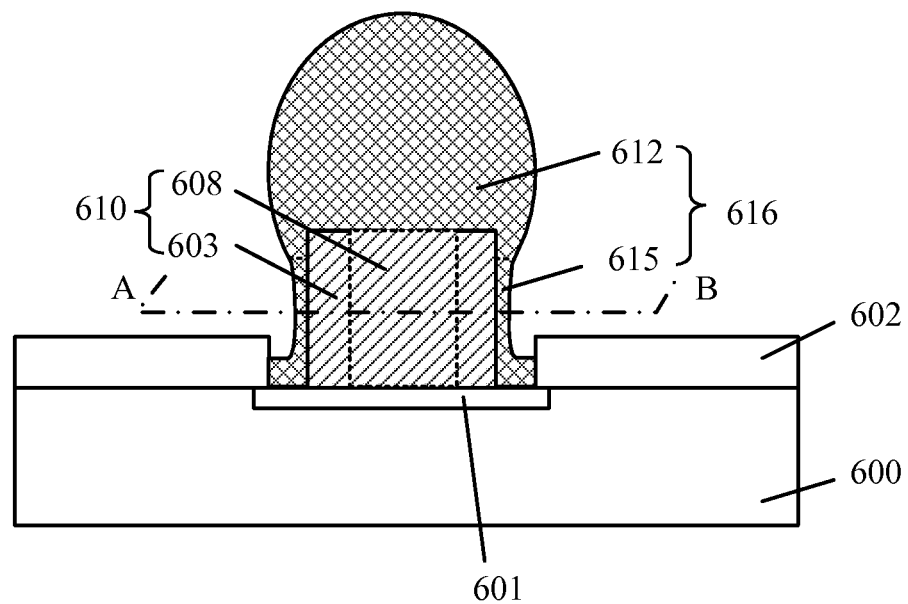
FIG. 41 illustrates another exemplary semiconductor device consistent with the disclosed embodiments.

FIG. 41 depicts a cross-sectional view of an exemplary semiconductor device in accordance with various disclosed embodiments. As shown, the exemplary semiconductor device includes: a semiconductor substrate 600. The semiconductor substrate 600 has a solder pad 601 thereon. The solder pad 601 on the semiconductor substrate 600 is connected with IC device(s) (not shown). A columnar electrode 610 is disposed on the solder pad 601. The columnar electrode 610 includes the bulk material 608 and a plurality of protruded parts 603 disposed on sidewall of the bulk material 608. A solder ball 616 is located on the columnar electrode 610. The solder ball 616 includes a convex metal head 612 on top of the columnar electrode and a skirt-shaped part 615 covering sidewall surface of the protruding portion 603.

A plurality of IC devices (not shown) can be configured on/in the semiconductor substrate 600, and the solder pad 601 can be connected with a corresponding IC device. The solder pad 601 can be made of aluminum and/or copper.

The bulk material 608 and the protruded parts 603 of the columnar electrode 610 can be connected together. At least more than one protruded part 603 can be included. When more than one protruded part 603 is included, adjacent protruded parts 603 may or may not be in direct contact with each other. The multiple protruded parts 603 can be distributed with equal angular distribution along a circle using a center of the bulk material 608 as the center of such circle, such that the adhesion/binding force at the contact area between the solder ball 616 and the columnar electrode 610 is uniform in all directions.

The bulk material 608 has a cross-sectional shape including a circle, polygon, and/or other suitable shapes. Each of the protruded part 603 has a cross-sectional shape including a triangular, rectangular, semicircular, irregular, and/or other suitable shapes. When the bulk material 608 has a cross-sectional shape of polygon, the polygon can be a regular polygon including such as an equilateral triangle, a square, a pentagon, a hexagon type, etc. When the protruded parts 603 have a cross-sectional shape of a triangular shape or a quadrangular shape, the triangular shape can be an isosceles triangle and a bottom side of the isosceles triangle is in contact with the sidewall of the bulk material. The quadrilateral shape can include a rectangular shape, a square shape, or an isosceles trapezoid shape, such that the adhesion/binding force at the contact area between the solder ball 616 and the columnar electrode 610 is uniform in all directions. Great details regarding the shapes of the bulk material 608 of the columnar electrode 610 and the protruded parts 603 are described as follows.

The columnar electrode 610 can be made of copper and formed by an electroplating process. During the electroplating process, a seed layer can be formed over the semiconductor substrate 600. The seed layer can be used as a conductive layer. A photoresist mask layer can be formed on the seed layer. The photoresist mask layer can include a groove to expose a surface portion of the seed layer. The groove can include a first etched hole corresponding to the bulk material 608 and a plurality of second etched holes corresponding to the protruded parts 603. The second etched holes are located surrounding the first etched hole. Sidewalls of the first and the second etched holes may be partially overlapped. Metal can be filled in the first and second etched holes by an electroplating process. The bulk material 608 and the plurality of protruded parts 603 located on perimeter sidewall of the bulk material 608 can be formed. The bulk material 608 and the protruded parts 603 can constitute the columnar electrode 610.

Due to the presence of the protruded parts 603, sidewall surface area of the columnar electrode 610 can be significantly increased. The contact area between the solder ball 616 and the columnar electrode 610 is greatly increased and such contact area is changed from a single plane contact surface into a multi-plane contact surface. The degree of adhesion/binding between the solder ball 616 and the columnar electrode 610 can be greatly enhanced. The solder ball 616 may bear greatly-enhanced external forces. Note that, the exemplary cross-sectional views of the semiconductor device showing in FIGS. 42-46 are along an A-B direction of the structure shown in FIG. 41.

The convex metal head 612 of the solder ball 616 can be located on the top surface of the columnar electrode 610. The convex metal head 612 can have a diameter greater than a diameter of the columnar electrode 610 (or a perpendicular distance between two sides of the columnar electrode). The skirt-shaped part 615 can have an upper portion connected to the lower portion of the convex metal head 612. The skirt-shaped part 615 of the solder ball 616 can cover a surface of the protruded parts 603. In the case when adjacent protruded parts 603 on outer sidewall of the bulk material 608 are not in contact with each other, the skirt-shaped part 615 can also cover a sidewall portion of the columnar electrode 610 exposed between adjacent protruded parts 603. The skirt-shaped part 615 can have an outer sidewall with a cross-sectional shape of an inwardly recessed arc.

In one embodiment, the columnar electrode 610 can have a dimension smaller than a dimension of the solder pad 601. The skirt-shaped part 615 can have a lower portion in contact with the solder ball 612. The skirt-shaped part 615 can have the lower portion with a width greater than a width of the upper portion of the skirt-shaped part 615 to form an L-type structure. The L-type skirt-shaped part 615 can contact the bottom of the solder pad 601. The L-shape skirt-shaped part can be considered as a support frame having a broader bottom to provide enhanced distribution of external forces exerted thereon. The L-type skirt-shaped part can allow the solder ball to bear greatly-enhanced lateral external forces.

The solder ball 616 can be formed by a screen printing process and a reflow process. For example, a solder paste layer can be formed on top surface and sidewall surface of the columnar electrode 610, followed by a reflow process of the solder paste to form a solder ball. The solder ball 616 can also be formed by a bump and reflow process.

A metal barrier layer (not shown) can be formed between the solder ball 616 and the columnar electrode 610. The metal barrier layer can be used to prevent direct contact between the columnar electrode and the solder ball and prevent generation of brittle copper-tin intermetallic compound at the contact surface between the solder ball and the columnar electrode. The brittle copper-tin intermetallic compound can affect stability of solder joints and can directly weaken the bonding strength between the solder ball and the columnar electrode. The metal barrier layer can be formed of a material including nickel, nickel-tin, and/or nickel-gold.

An insulating layer 602 can be formed on the semiconductor substrate 600. The insulating layer 602 can be used for sealing and insulation. The insulating layer 602 can have an opening with a sidewall in contact with the sidewall of the skirt-shaped part 602. The insulating layer 602 can have a single-layer structure or a multi-layer structure. The insulating layer 602 can be made of, e.g., polybenzoxazole (PBO), polyimide, other suitable organic resins, and/or other suitable materials.

In other embodiments, the skirt-shaped part can cover only a surface of the upper portion of the protruded parts 603. In other embodiments, a re-wiring layer can be formed over the semiconductor substrate. The re-wiring layer can be connected to the solder ball, and can be used as a part of the solder ball. The columnar electrode can be disposed over the re-wiring layer.

FIGS. 42-46 are cross sectional views of the exemplary structure depicted in FIG. 41 along a direction A-B. The shape, dimension, and connection of the bulk material 608 of the columnar electrode 610 and the protruded parts 603 can be described herein as follows.

Figure 42:
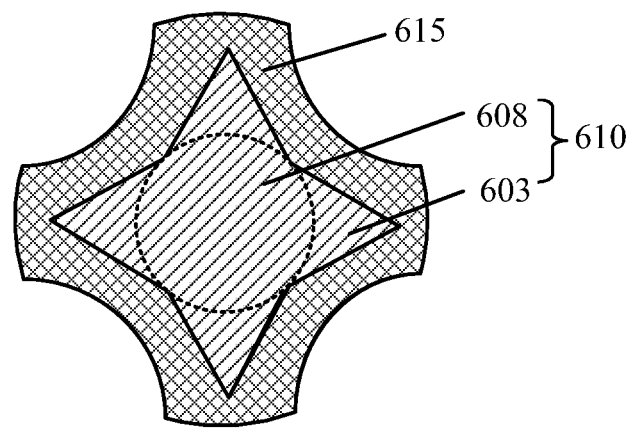
FIGS. 42-46 illustrate various exemplary top views of a semiconductor device consistent with the disclosed embodiments.

In one embodiment, referring to FIG. 42, the bulk material 608 of the columnar electrode 610 has a circular cross-section, and the protruded parts 603 has a triangle cross-section including, e.g., an isosceles triangle. Note that, when the bulk material 608 has a circular cross-section, the contact area between the bulk material 608 and the protruded parts 603 can be conformal with one another, e.g., having arc edges. For example, the bottom side of the isosceles triangle of the protruded parts 603 can include an arc section having arc edges. The skirt-shaped part 615 can cover a surface of the protruded parts 603. About two or more triangle-shaped protruded parts 603 can be included. The triangle-shaped protruded parts 603 can be distributed with equal angular distribution on a circle centered by a center of the bulk material 608. Adjacent protruded parts 603 may or may not contact each other. Note that, FIG. 42 shows four protruded parts 603 having an isosceles triangle cross-section only as an example. More than or less than four protruded parts with any desired cross-section(s) can be included herein in accordance with various embodiments.

Figure 43:
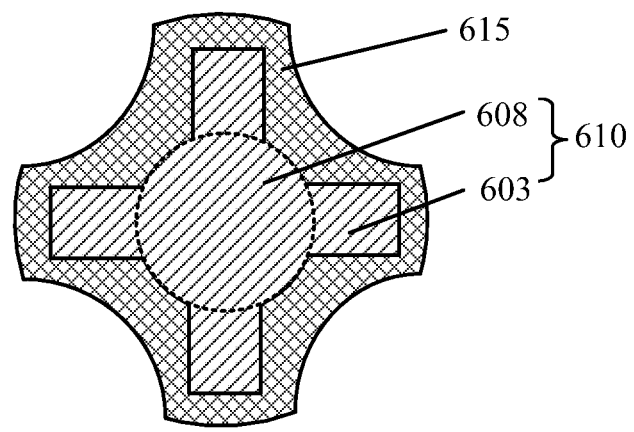

In another embodiment, referring to FIG. 43, the bulk material 608 of the columnar electrode 610 has a circular cross-section, and the protruded parts 603 has a quadrangular cross-section including, e.g., a rectangle, square, and/or isosceles trapezoid. The skirt-shaped part 615 can be formed to cover the protruded parts 603 and a portion of the sidewall surface of the bulk material 608. The outer sidewall of the skirt-shaped part 615 has a cross-sectional shape of an inwardly recessed arc. Two or more exemplary quadrilateral protruded parts 603 can be included and can be distributed with equal angular distribution on a circle centered by a center of the bulk material 608. Adjacent protruded parts 603 may or may not contact each other. Note that, FIG. 43 shows four rectangular protruded parts 603 without contacting each other, as an example only. More than or less than four protruded parts with any desired cross-section(s) can be included herein in accordance with various embodiments.

Figure 44:
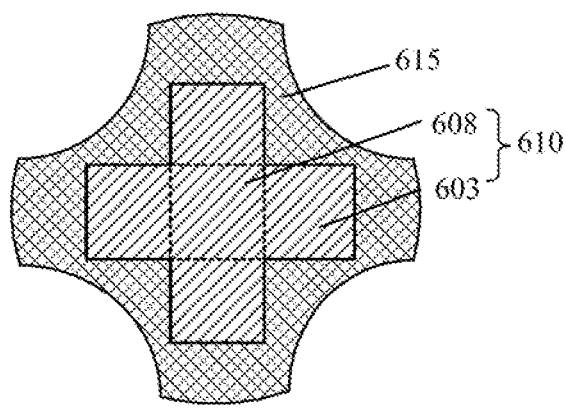

In another embodiment, referring to FIG. 44, the bulk material 608 of the columnar electrode 610 has a quadrilateral cross-section including a square cross-section. The protruded parts 603 have a quadrilateral cross-section including a square, rectangular, and/or isosceles trapezoid. Adjacent protruded parts 603 may or may not contact each other. The cross-section of the protruded parts 603 can have a side length (e.g., which is in contact with the bulk material 608) equal to or less than a side length of the cross-section of the bulk material 608. The skirt-shaped part 615 can cover a sidewall surface of the protruded parts 603 (and/or a portion of the bulk material 608). The outer sidewall of the skirt-shaped part 615 has a cross-sectional shape of an inwardly recessed arc.

In various embodiments, two or four quadrilateral protruded parts 603 can be included and can be distributed with equal angular distribution on a circle centered by a center of the bulk material 608. Note that, FIG. 44 shows four square protruded parts 603 connected with each other as an example only. In other embodiments, when the cross-section of the protruded parts 603 has a side length less than a side length of the cross-section of the bulk material 608, multiple protruded parts (e.g., about two or more) can correspond to one side of the cross-section of the bulk material. Still in other embodiments, when the cross-section of the bulk material 608 is polygon having an even number of sides, each protruded part 603 is located on each side or every other side of the cross section of the bulk material 608.

Figure 45:
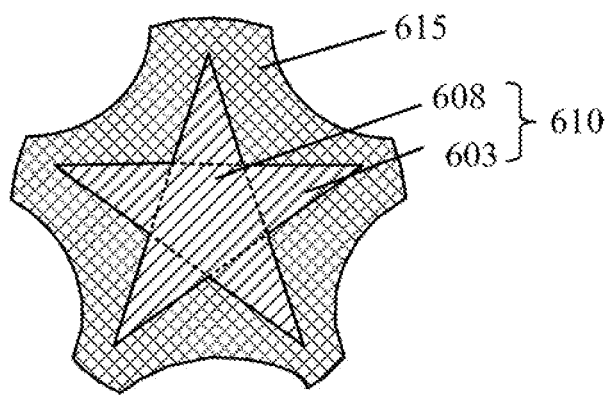

In another embodiment, referring to FIG. 45, the bulk material 608 of the columnar electrode 610 has a pentagonal cross-section including a regular pentagon cross-section, and the protruded parts 603 has a triangle cross-section including, e.g., an isosceles triangle cross-section, and/or a quadrilateral cross-section including, e.g., a cross-section of rectangle, square, and isosceles trapezoid. Adjacent protruded parts 603 may or may not contact each other. The cross-section of the protruded parts 603 can have a side length (e.g., which is in contact with the bulk material 608) equal to or less than a side length of the cross-section of the bulk material 608. The skirt-shaped part 615 can cover a sidewall surface of the protruded parts 603 (and/or a portion of the bulk material 608). The outer sidewall of the skirt-shaped part 615 has a cross-sectional shape of an inwardly recessed arc.

As shown in FIG. 45, five protruded parts 603 can be included and can be distributed with equal angular distribution on a circle centered by a center of the bulk material 608. In other embodiments, when the cross-section of the bulk material 608 is polygon having an odd number of sides, each protruded part 603 is located on each side of the cross section of the bulk material 608.

Figure 46:
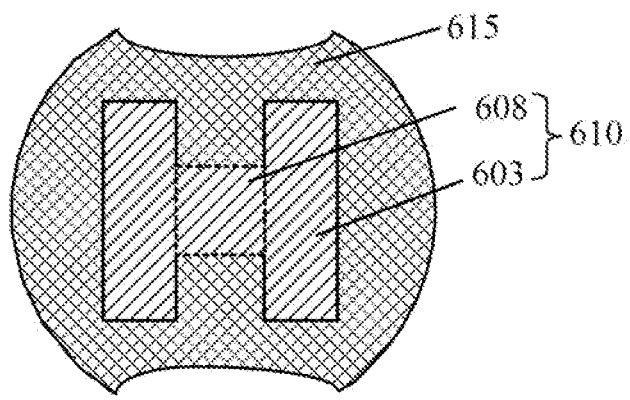

In another embodiment, referring to FIG. 46, the bulk material 608 of the columnar electrode 610 has a square or rectangular cross-section, and the protruded parts 603 are located on parallel sides of the square or rectangular cross-section of the bulk material 608. The protruded parts 603 have a rectangular cross-section. The cross-section of the protruded parts 603 can have a side length (e.g., which is in contact with the bulk material 608) greater than a corresponding side length of the cross-section of the bulk material 608. The protruded parts 603 can have an isosceles triangle, isosceles trapezoid, or semicircle cross-section. In other embodiments, when the cross-section of the bulk material 608 is polygon having an even number of sides, each protruded part 603 is located on paralleled sides of the cross section of the bulk material 608. The cross-section of the protruded parts 603 can have a side length (e.g., which is in contact with the bulk material 608) greater than a corresponding side length of the cross-section of the bulk material 608.

In this manner, a columnar electrode on a solder ball includes a bulk material and a plurality of protruded parts disposed on perimeter sidewall of the bulk material to greatly enhance surface area of the columnar electrode. The solder ball on the columnar electrode includes a convex metal head located on top of the columnar electrode and a skirt-shaped part located on surface of the protruded parts. Due to presence of the protruded parts, sidewall surface area of the columnar electrode is greatly increased. Contact area between the solder ball and the columnar electrode is greatly increased, e.g., increased from a single plane surface to a multi-plane surface, and thus adhesion/binding there-between is significantly enhanced. When subjected to external forces, the external forces exerted on the solder ball can be distributed on the multi-plane surface between the solder ball and the columnar electrode. Acceptable external forces (e.g., a force to detach the solder ball from the columnar electrode) of the solder ball can be increased.

Further, the plurality of protruded parts can be distributed with equal angular distribution along a circle centered by the center of the bulk material. The bulk material can have a circular or a regular polygonal cross-section. The protruded parts can have an isosceles triangle, rectangle, square, isosceles trapezoid or semicircle cross-section such that centers of the protruded parts in all directions are distanced the same from the center of the bulk material, and sidewalls on both sides of the protruded parts are symmetrical. The skirt-shaped part of the solder ball covers the protruded parts, such that adhesion/binding force at the contact area between the solder ball and the columnar electrode is uniform in all directions.

Thus, the disclosed methods and structures may provide many advantageous IC packaging applications. Other applications and advantages are obvious to those skilled in the art. The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A method for forming a semiconductor device, comprising:

providing a semiconductor substrate including a plurality of solder pads on the semiconductor substrate;

forming a first insulating layer over the semiconductor substrate, the first insulating layer including a first opening to expose a solder pad of the plurality of solder pads;

forming a seed layer on a portion of the first insulating layer and on a bottom and a sidewall of the first opening, the seed layer contacting the solder pad;

forming a re-wiring layer on a first portion of the seed layer and within the first opening, wherein the re-wiring layer is electrically connected to the solder pad;

forming a columnar electrode on a portion of the re-wiring layer outside of the first opening, the columnar electrode including a bulk material and a through hole in the bulk material, the through hole exposing at least a surface portion of the re-wiring layer; and forming a solder ball on the columnar electrode, the solder ball including a convex metal head on a top surface of the bulk material of the columnar electrode and a filling part filled in the through hole in the columnar electrode;

wherein forming the columnar electrode includes:

forming a third photoresist layer on the re-wiring layer and on a second portion of the seed layer, the third photoresist layer including a groove outside of the first opening to expose a surface portion of the re-wiring layer, and at least one third photoresist layer column being within the groove;

filling the groove with a metal to form the bulk material of the columnar electrode;

removing the at least one third photoresist layer column and the third photoresist layer outside of the bulk material to leave a through hole at a position corresponding to the at least one third photoresist layer column, wherein the through hole and the bulk material constitute the columnar electrode; and using the re-wiring layer as an etch mask to remove the second portion of the seed layer to provide an exposed portion of the first insulating layer.

2. The method of claim 1, wherein forming the solder ball includes:

forming a second insulating layer on the re-wiring layer and on the exposed portion of first insulating layer, wherein the second insulating layer has a top surface lower than the top surface of the columnar electrode;

forming a fourth photoresist layer on the second insulating layer, wherein the fourth photoresist layer includes a sixth opening to expose the columnar electrode and a first portion of the second insulating layer outside of the columnar electrode;

using the fourth photoresist layer and the bulk material of the columnar electrode as a mask to remove the first portion of the second insulating layer from the through hole;

removing the fourth photoresist layer;

placing a printing screen plate or a stainless steel plate on the first insulating layer, the printing screen plate or the stainless steel plate including an eighth opening to expose the bulk material of the columnar electrode and the through hole;

filling the eighth opening and the through-hole with a solder paste;

removing the printing screen plate or the stainless steel plate; and performing a reflow process on the solder paste to form the convex metal head on the top surface of the columnar electrode and to form the filling part in the through hole, wherein the convex metal head and the filling part constitute the solder ball.

3. The method of claim 1, wherein forming the solder ball includes:

forming a second insulating layer on the re-wiring layer and on the exposed portion of first insulating layer, wherein the second insulating layer has a top surface lower than the top surface of the columnar electrode;

forming a fourth photoresist layer on the second insulating layer, the fourth photoresist layer including a sixth opening to expose the columnar electrode, an outer sidewall of the columnar electrode, and a first portion of the second insulating layer outside of the columnar electrode;

using the fourth photoresist layer and the bulk material of the columnar electrode as a mask to remove the first portion of the second insulating layer from the through hole and to remove a second portion of the second insulating layer on the outer sidewall of the columnar electrode to form an annular groove on the outer sidewall of the columnar electrode to expose a surface portion of the re-wiring layer;

removing the fourth photoresist layer;

placing a printing screen plate or a stainless steel plate on the second insulating layer, the printing screen plate or the stainless steel plate including a seventh opening to expose the bulk material of the columnar electrode, the through hole, and the annular groove;

filling the seventh opening, the through-hole, and the annular groove with a solder paste;

removing the printing screen plate or the stainless steel plate; and performing a reflow process on the solder paste to form the convex metal head on the top surface of the columnar electrode, to form the filling part in the through hole, and to form a skirt-shaped part on the outer sidewall of the bulk material of the columnar electrode, wherein the convex metal head, the filling part, and the skirt-shaped part constitute the solder ball.

* * * * *